United States Patent [19]
Numata et al.

[11] Patent Number: 6,141,288
[45] Date of Patent: Oct. 31, 2000

[54] SEMICONDUCTOR MEMORY DEVICE ALLOWING CHANGE OF REFRESH MODE AND ADDRESS SWITCHING METHOD THEREWITH

[75] Inventors: Kenji Numata, Yamato; Masaki Ogihara, Yokohama, both of Japan

[73] Assignee: Kabushiki Kaisha Toshiba, Kawasaki, Japan

[21] Appl. No.: 09/314,028

[22] Filed: May 19, 1999

Related U.S. Application Data

[63] Continuation of application No. 09/102,627, Jun. 23, 1998, Pat. No. 5,970,015, which is a continuation of application No. 08/683,780, Jul. 16, 1996, Pat. No. 5,812,481, which is a continuation of application No. 08/438,656, May 9, 1995, Pat. No. 5,559,748, which is a continuation of application No. 07/935,174, Aug. 26, 1992, abandoned.

[30] Foreign Application Priority Data

Aug. 30, 1991 [JP] Japan .................................. 3-219926
Aug. 20, 1992 [JP] Japan .................................. 4-221694

[51] Int. Cl.[7] .................................................. G11C 8/00
[52] U.S. Cl. ..................................... 365/230.03; 365/222
[58] Field of Search ............................. 365/222, 230.03, 365/230.06, 236, 230.01

[56] References Cited

U.S. PATENT DOCUMENTS

| | | | |
|---|---|---|---|
| 4,862,420 | 8/1989 | Toda et al. ................................ | 365/191 |
| 4,933,907 | 6/1990 | Kumanoya et al. ..................... | 365/222 |
| 4,990,800 | 2/1991 | Lee .......................................... | 307/465 |
| 5,023,843 | 6/1991 | Love ........................................ | 365/222 |
| 5,109,360 | 4/1992 | Inazumi et al. ..................... | 365/230.02 |
| 5,373,475 | 12/1994 | Nagase .................................... | 365/222 |
| 5,467,315 | 11/1995 | Kajimoto et al. ....................... | 365/222 |
| 5,559,748 | 9/1996 | Numata et al. .......................... | 365/222 |

FOREIGN PATENT DOCUMENTS

| | | |
|---|---|---|
| 0 389 202 | 9/1990 | European Pat. Off. . |
| 0 476 282 | 3/1992 | European Pat. Off. . |
| 0 528 352 | 2/1993 | European Pat. Off. . |
| 2-68791 | 3/1990 | Japan . |

*Primary Examiner*—David Nelms
*Assistant Examiner*—Hoai V. Ho
*Attorney, Agent, or Firm*—Banner & Witcoff, Ltd.

[57] ABSTRACT

A semiconductor integrated circuit device is described. The semiconductor device includes a switching signal generator having an output terminal which outputs a switching signal to change refresh modes. The semiconductor device also includes a first address buffer having an output terminal which outputs a first address signal, a second address buffer having an output terminal which outputs a second signal, a decoder having a first input terminal which receives the first address signal and having a second input terminal, a sense amplifier controller having an input terminal, and a switch having a first input terminal which receives the switching signal, a second input terminal which receives the second address signal, a first output terminal which outputs the second address signal to the second input terminal of the decoder and a second output terminal which outputs the second address signal to the input terminal of the sense amplifier controller, the switch being controlled by the switching signal.

14 Claims, 21 Drawing Sheets

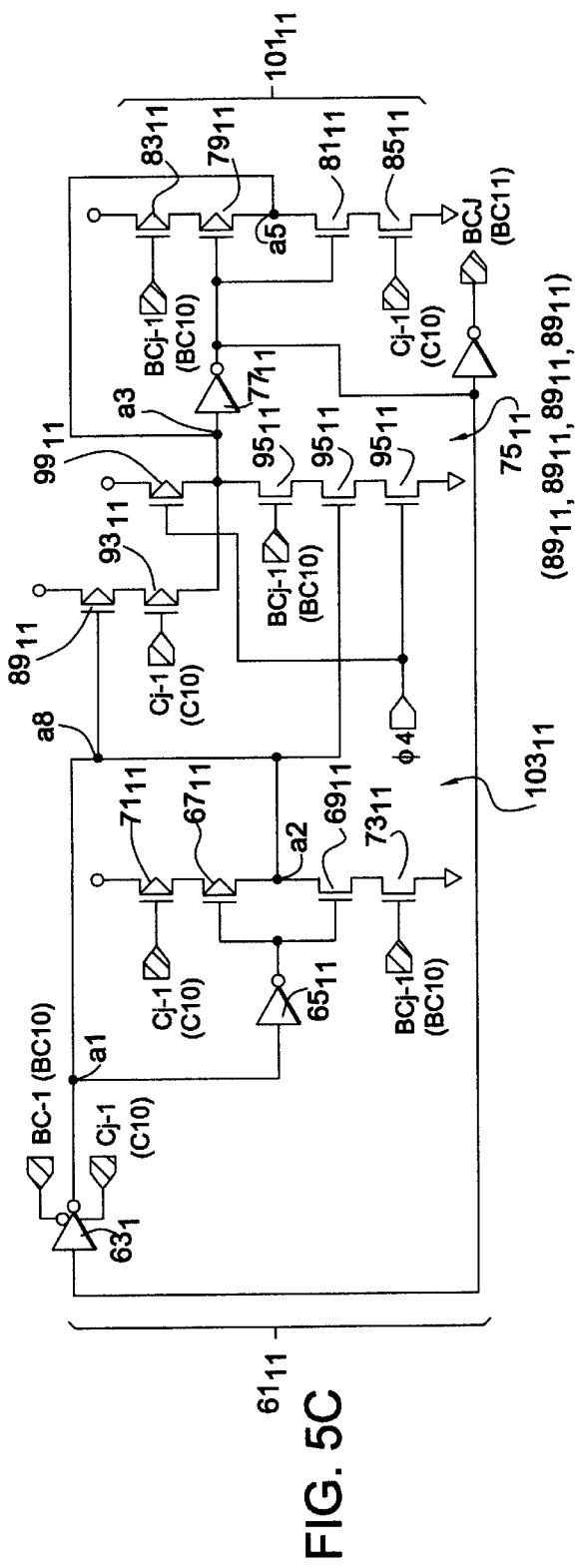
FIG. 5C
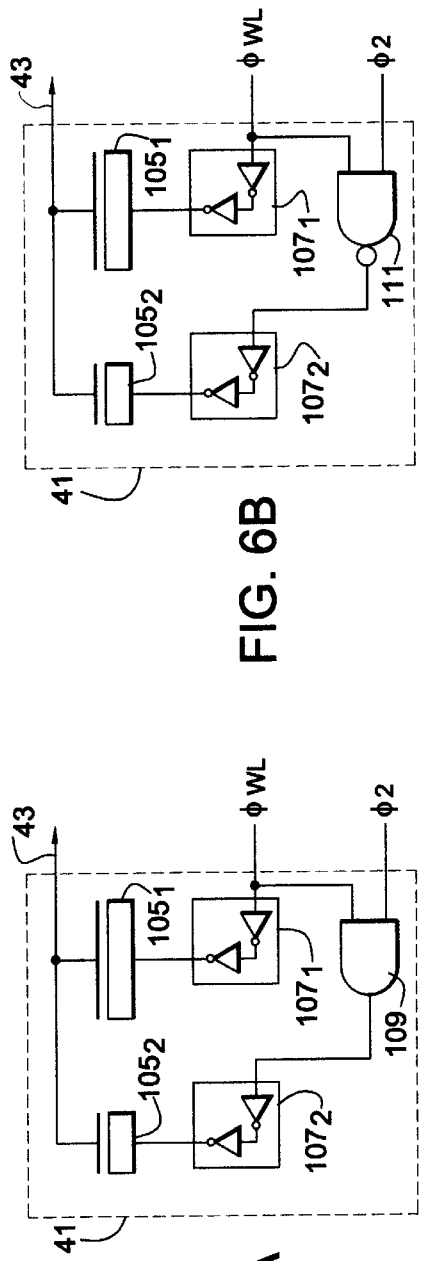
FIG. 6B
FIG. 6A

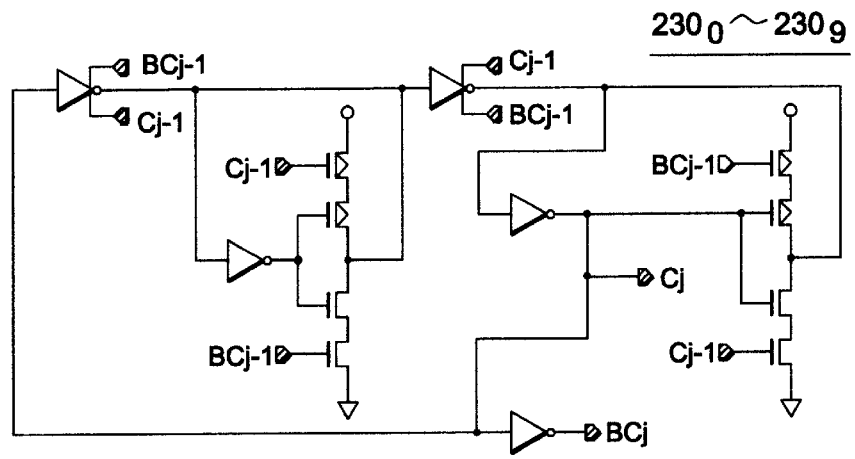
FIG. 19A
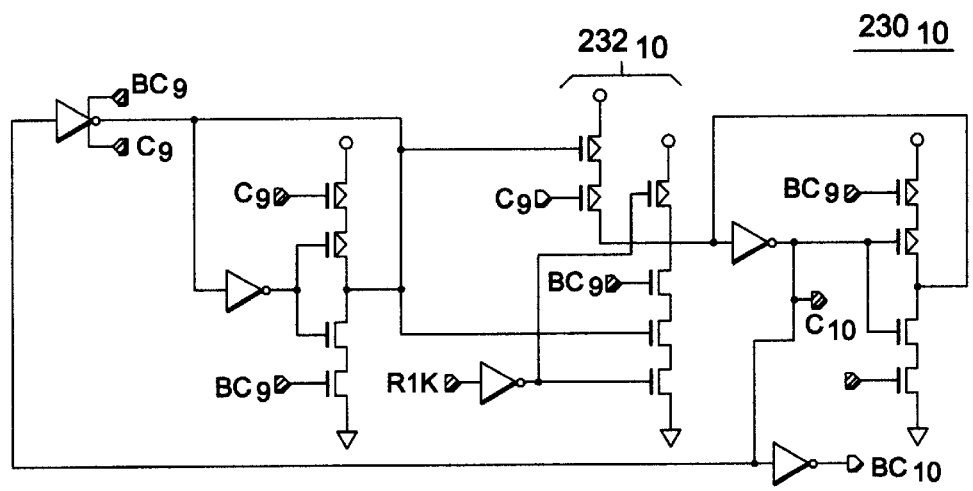
FIG. 19B
FIG. 19C
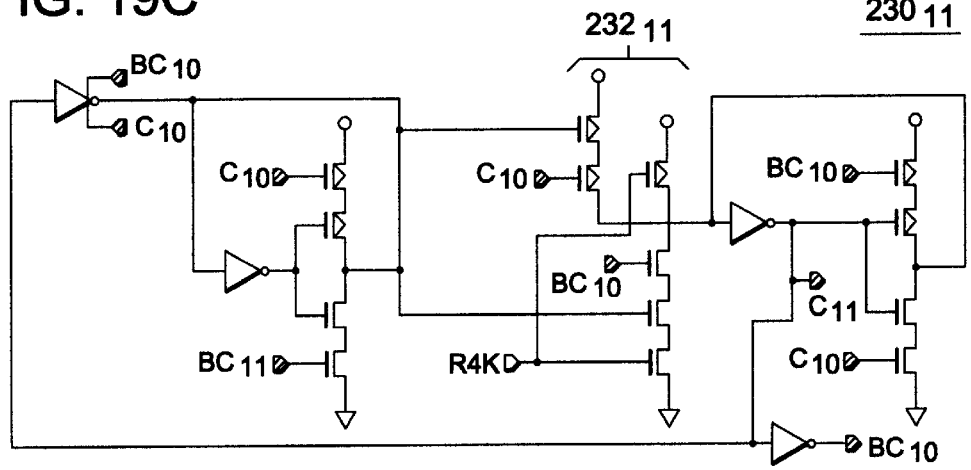

| | VR2K | VR1K | R1K | R2K | R4K |
|---|---|---|---|---|---|
| 1KCYCLE | H | L | H | H | L |
| 2KCYCLE | L | H | L | H | L |
| 4KCYCLE | L | L | L | L | H |

| | A | B |
|---|---|---|
| 1KCYCLE | Y8Y | Y9Y |
| 2KCYCLE | Y8Y | X10X |
| 4KCYCLE | X11X | X10X |

CHIP SCREENING TEST (2K CYCLE REFRESH OR 4K CYCLE REFRESH)

TEST A; OPERATING CURRENT TEST (2K CYCLE REFRESH)
TEST B; TYPICAL VOLTAGE TEST (4K CYCLE REFRESH)
TEST C; CELL TO CELL INTERFERENCE TEST (2K CYCLE REFRESH)
...
PAUSE TEST (2K CYCLE REFRESH AND 4K CYCLE REFRESH)

SEMICONDUCTOR MEMORY DEVICE ALLOWING CHANGE OF REFRESH MODE AND ADDRESS SWITCHING METHOD THEREWITH

This application is a Continuation of U.S. Application Ser. No. 09/102,627, filed Jun. 23, 1998, now U.S. Pat. No. 5,970,015; which is a Continuation of U.S. Application Ser. No. 08/683,780, filed Jul. 16, 1996; now U.S. Pat. No. 5,812,481; which is a Continuation of U.S. Application Ser. No. 08/438,656, filed May 9, 1995, now U.S. Pat. No. 5,559,747; which is a Continuation of Application Ser. No. 07/935,174, filed on Aug. 26, 1992, abandoned.

BACKGROUND OF THE INVENTION

1. Field of the Invention

This invention relates to a semiconductor integrated circuit device allowing the change of the product specification and a chip screening method therewith.

2. Description of the Related Art

In dynamic RAMs (hereinafter, referred to as DRAMs), the ratio of the refresh time T to the refresh cycle R is T/R=15.6 μsec. This ratio holds true for each generation of DRAMs: for example, 8 msec/512 cycles for the 1 Mbit DRAM generation, and 16 msec/1024 cycles (hereinafter, 1024 cycles are referred to as 1-kcycles) for the 4 Mbit DRAM generation.

For the 16 Mbit DRAM generation and later, the relationship should be 32 msec/2048 cycles (hereinafter, 2048 cycles are referred to as 2-kcycles). To reduce power consumption, prevent heat generation, and make the active current smaller, however, it is necessary to increase the number of refresh cycles to decrease the number of cell arrays to be activated at the same time. For example, the number of refresh cycles is increased to 4096 cycles (hereinafter, referred to as 4-kcycles).

Additionally, there is a need to reduce the number of refresh cycles in order to manufacture multi-bit symmetrical address products. For example, 1-kcycles are used. To prevent the chip size from becoming larger and to ensure the sensitivity ($C_B/C_S$ where $C_B$ is the bit-line capacity and $C_S$ is the cell capacity), the number of cells per bit-line cannot be changed from the present value (for examine, 128 cells per bit-line), so that it is natural to change the number of refresh cycles.

Changing the number of refresh cycles means that the chip must be redesigned each time the number is changed. This imposes a heavy burden on the circuit designing personnel, resulting in reduced development efficiciency.

More diversification of products requires factories to produce a variety of products simultaneously, reducing the production efficiency.

Additionally, the conventional chip screening test only rejects defective products. In this test, chips that fail to come up to the passing mark set for each product are judged to be unacceptable, and are discarded. Because of this, the conventional chip screening test has contributed to a poorer product yield.

SUMMARY OF THE INVENTION

The object of the present invention is to provide a semiconductor integrated circuit device which is a solution to the problem that the diversification of products reduces development and production efficiencies, or which allows the product diversification without the sacrifice of development and production efficiencies.

Another object of the present invention is to provide a chip screening method capable of improving the product yield.

The foregoing object is accomplished by providing a semiconductor integrated circuit device comprising: an integrated circuit section containing a first circuit section having a first function and a second circuit section having a second function; an active signal generator section for producing an active signal for activating the first circuit section or the second circuit section; receiving means for taking in a decision signal for determining the product specification; a switching signal generator section, connected to the receiving means, for producing a switching signal for changing the product specification based on the decision signal; and switching means which, based on the switching signal, changes the supply of the active signal to either the first circuit section or to the second circuit section.

With the present invention, a decision signal to determine the product specification is produced, and based on this signal, the function of the integrated circuit section is modified to meet the product specification, thereby making it possible to produce more than one type of product from a single product. This makes it unnecessary for the designing personnel to design the respective circuits to meet product specifications (or product types), increasing development efficiency. This approach also allows various types of products to share almost all manufacturing processes, improving production efficiency.

Further, the second object is accomplished by providing a chip screening method comprising: the chip screening step of selecting semiconductor chips, which includes a select test for determining whether semiconductor chips are acceptable or not, and a pause test for checking the memory cell for the charge retaining characteristics; and the product specification switching step of changing the product specification of the chips based on the result of the pause test.

In the chip screening test, by changing the product specification to that of the chip corresponding to the pause time based on the result of the pause test in the screening step, chips that would be unacceptable in the conventional test can be saved. This prevents the yield especially in the screening test from decreasing, and consequently improves the product yield.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A to 5C are circuit diagrams of the counters of FIG. 4;

FIGS. 6A and 6B are circuit diagrams of the word-line step-up section of FIG. 1;

FIGS. 19A to 19C are circuit diagrams of the counter circuit group of FIG. 14;

DETAILED DESCRIPTION OF THE PREFERRED EMBODIMENTS

Figure 1:
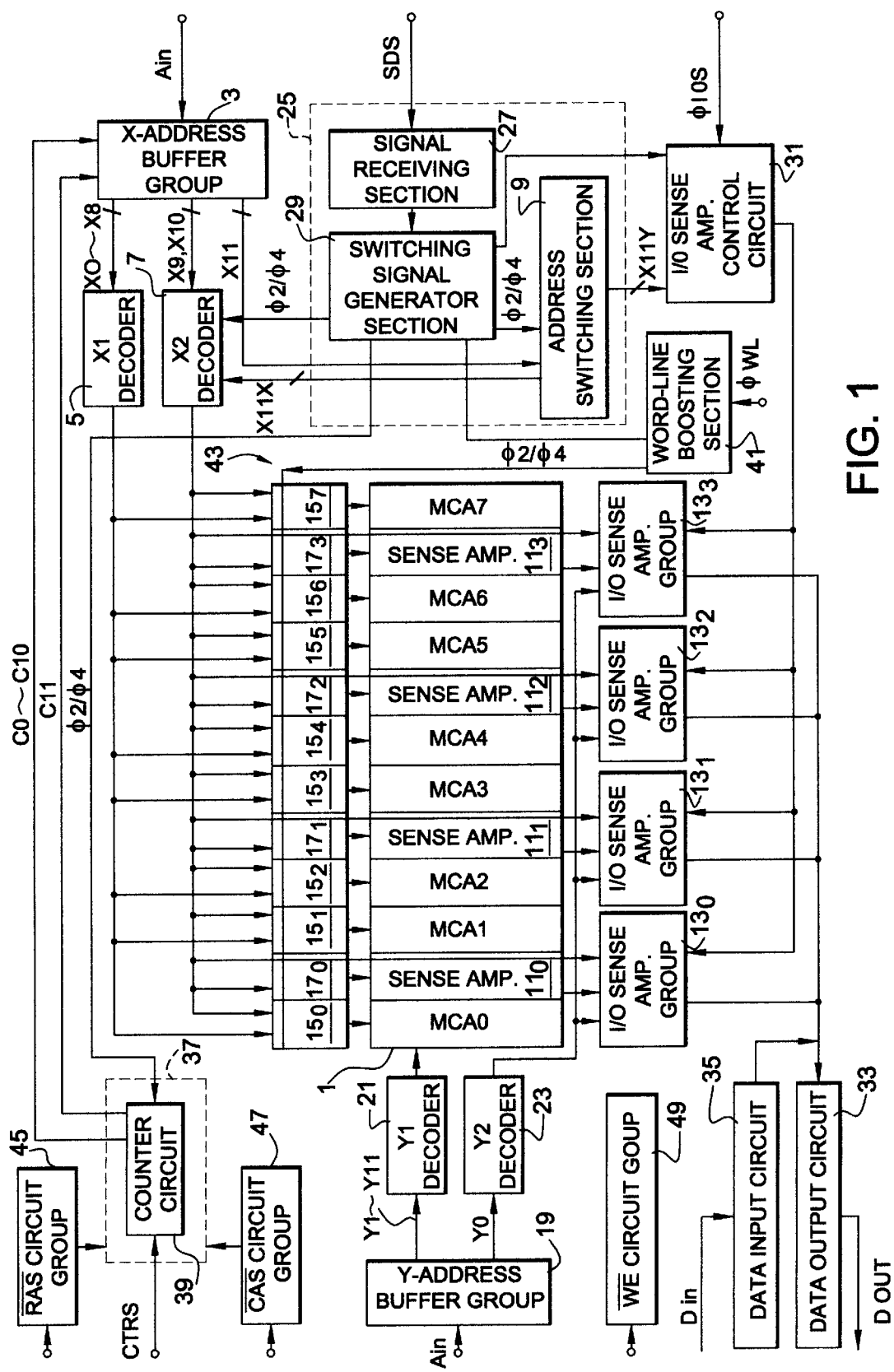
FIG. 1 is a block diagram of a DRAM according to a first embodiment of the present invention.

Referring to the accompanying drawings, embodiments of the present invention will be explained. Like parts are indicated by corresponding reference characters throughout all the figures, and repetitious explanation will be omitted.

FIG. 1 is a block diagram of a DRAM according to a first embodiment of the present invention. The DRAM, i.e., the first embodiment, can operate in 2k-refresh cycle mode and 4k-refresh-cycle mode.

As shown in FIG. 1, a memory cell array (hereinafter, referred to as the MCA) 1 is divided into eight sections $MCA_0$ to $MCA_7$. An X-address buffer group 3, which receives an address input signal $A_{in}$, produces a plurality of X-address signals. The X-address signals are set to first X-addresses $X_0$ to $X_8$ and second X-addresses $X_9$ and $X_{10}$ for division operation of $MCA_0$ to $MCA_7$, and to a third X-address $X_{11}$ for changing the product specification. An X1-decoder 5, which is supplied with the first X-addresses $X_0$ to $X_8$, decodes the first addresses $X_0$ to $X_8$ to produce a signal for selecting a word-line (a row) of the MCA. An X2-decoder 7 is supplied with the second X-addresses $X_9$ and $X_{10}$ and also with the third X-address $X_{11x}$ via an address switching section 9. When the 2-kcycle DRAM is selected, the X2-decoder 7 decodes the second X-addresses $X_9$ and $X_{10}$ to produce a signal for simultaneously selecting one array from $MCA_0$ to $MCA_3$ and one array from $MCA_4$ to $MCA_7$, a signal for selecting sense amplifiers $11_0$ to $11_3$, and a signal for selecting I/O sense amplifier groups $13_0$ to $13_3$. When the 4-kcycle DRAM is selected, the X2-decoder 7 decodes the second X-addresses $X_9$ and $X_{10}$ and the third X-address $X_{11}$ to produce a signal for selecting one array from $MCA_0$ to $MCA_7$, a signal for selecting sense amplifiers $11_0$ to $11_3$, and a signal for selecting the I/O sense amplifier groups $13_0$ to $13_3$. In FIG. 1, blocks indicated by reference numerals $15_0$ to $15_3$ are word-line driving circuits, and blocks indicated by reference numerals $17_0$ to $17_3$ are sense amplifier driving circuits. A Y-address buffer group 19, which receives the address input signal $A_{in}$, generates a plurality of Y-address signals. The Y-address signals are set to first Y-addresses $Y_1$ to $Y_{11}$ and a second Y-address $Y_0$. A Y1-decoder 21, which is supplied with the first Y-addresses $Y_1$ to $Y_{11}$ decodes the first Y-addresses $Y_1$ to $Y_{11}$ to produce a signal for selecting a bit line (a column) of the MCA. A Y2-decoder 23 decodes the second Y-address $Y_0$ to generate a signal for selecting, for example, one of the I/O sense amplifiers contained in the I/O sense amplifier group 13.

The DRAM of FIG. 1 is provided with a product specification deciding section 25 for deciding the product specification semipermanently. The product specification deciding section 25 is composed of a receiving section 27 that receives a product specification decision signal SDS to decide the product specification semipermanently, a switching signal generator section 29, connected to the receiving section 27, for producing internal switching signals φ2 and φ4 to change product specifications based on the signal SDS, and an address signal switching section 9 for selecting the destination of the address signal based on the signals φ2 and φ4.

The operation of the product specification deciding section 25 will be explained.

When the product specification decision signal SDS specifies the 2-kcycle refresh product (mode), the switching signal generator section 29 produces a 2-kcycle refresh product (mode), the switching signal generator section 29 produces a 2-kcycle refresh product (mode) switching signal φ2, and supplies it to the address signal switching section 9 and I/O sense amplifier control circuit 31. The address signal switching section 9, based on the signal φ2, changes the third address $X_{11}$ to address $X_{11Y}$ and supplies the resulting signal to the I/O sense amplifier control circuit 31.

When the product specification decision signal SDS specifies the 4-kcycle refresh product (mode), the switching signal generator section 29, based on the signal SDS, produces a 4-kcycle refresh product (mode) switching signal φ4, and supplies it to the address signal switching section 9 and X2-decoder 7. The address signal switching section 9 changes the third address $X_{11}$ to address $X_{11x}$ based on the signal φ4 and supplies the resulting signal to the X2-decoder 7. The signals φ2 and φ4 are, for example, complementary to each other. The switching signal generator section 29 supplies the inversion in level of signal $\phi 2$ to the I/O sense amplifier control circuit 31.

The data read operation of the 2-kcycle refresh memory product and the 4-kcycle refresh product (mode) will be explained.

In the case of the 2-kcycle refresh product (mode), the I/O sense amplifier control circuit 31 is supplied with address $X_{11Y}$, which activates the former. The control circuit 31 produces a signal for selecting either a pair of I/O sense amplifiers $13_0$ and $13_1$ or a pair of I/O sense amplifiers $13_2$ and $13_3$. The X2-decoder 7 produces a signal for simultaneously selecting one array from $MCA_0$ to $MCA_3$ and one array from $MCA_4$ to $MCA_7$. The I/O sense amplifier group that finally supplies the data is one selected by the X2-decoder 7 and control circuit 31. The reading of data is done by causing the Y1-decoder 21 to decode the first Y-address produced at the Y-address buffer group 19, amplifying the information from the memory cell at the I/O sense amplifier group that finally supplies the data, and supplying the output signal Dout from the data output circuit 33. In FIG. 1, a block indicated by numeral 35 is a data input circuit to which the input signal Din is supplied.

In the case of the 4-kcycle refresh product (mode), address $X_{11X}$ is supplied to the X2-decoder 7 instead of the I/O sense amplifier control circuit 31. The X2-decoder 7 then produces a signal for activating only one array of $MCA_0$ to $MCA_7$. The control signal 31 receives the inversion in level of signal $\phi 2$, and based on the inverted signal, produces a signal for selecting either a pair of I/O sense amplifiers $13_0$ and $13_1$ or a pair of I/O sense amplifiers $13_2$ and $13_3$. The I/O sense amplifier 13 finally activated is one selected by the X2-decoder 7 and control circuit 31.

As described above, a semiconductor integrated circuit device thus constructed enables a single chip to deal with different refresh-cycles by switching the third X-address $X_{11}$ to either $X_{11X}$ or $X_{11Y}$ at the switching section 9.

Refresh operation is performed by selecting a word-line and at the same time, by operating the sense amplifiers $11_0$ to $11_3$.

The DRAM of FIG. 1 is provided with a counter refresh circuit group 37, which contains a counter circuit 39. The counter circuit 39 is supplied with a signal CTRS for commanding the count start and switching signals $\phi 2$ and $\phi 4$. The counter circuit 39, based on the signal CTRS, supplies counter output signals $C_0$ to $C_{11}$ that count up X-addresses $X_0$ to $X_{11}$ in sequence, and based on the signals $\phi 2$ and $\phi 4$, changes the number of output signals $C_0$ to $C_{11}$. This is done to make the number of X-addresses equal to the number of counter output signals, because the 2-kcycle product (mode) differs from the 4-kcycle product (mode) in the number of X-addresses supplied to the row decoder (X1-decoder 5 and X2-decoder 7). In this embodiment, when the switching signal $\phi 2$ is supplied, the counter circuit 39 will not supply signal $C_{11}$. This is because the third X-address $X_{11}$ is ignored since in the case of the 2-kcycle product (mode), the third X-address $X_{11}$ is not supplied to the row decoder (X1-decoder 5 and X2-decoder 7). When the switching signal $\phi 4$ is supplied (or when the level of switching signal $\phi 2$ is reversed and supplied), the counter circuit 39 will supply signal $C_{11}$.

The DRAM of FIG. 1 is provided with a word-line boosting section 41, to which switching signals $\phi 2$ and $\phi 4$ and boosting signal $\phi WL$ are supplied. The word-line boosting section 41 raises the word-line voltage based on signal $\phi WL$. In FIG. 1, numeral 43 indicates the boosting line to which a boosting voltage is supplied. In the present invention, the word-line boosting capacitance is also changed on the basis of signals $\phi 2$ and $\phi 4$. This is done to optimize the level of the word-line boosting capacitance according to a change in word-line load capacitance, since the number of word lines activated at a time in the 2-kcycle product differs from that in the 4-kcycle products. In the case of 2-kcycle products, because two MCAs are selected, this increases the number of word lines activated, making the load capacitance larger. To compensate for the increase in the load capacitance, the word-line boosting section 41 increases the word-line boosting capacitance based on signal $\phi 2$ in the case of the 2-kcycle product. When signal $\phi 4$ is supplied (or when the level of switching signal $\phi 2$ is inverted and supplied; in the case of 4-kcycle product), the word-line boosting section 41 reduces the word-line boosting capacitance more than in the 2-kcycle product.

The peripheral circuitry of the FIG. 1 DRAM contains a /RAS (hereinafter, / is used as a symbol indicating an inverted signal) circuit group 45, a /CAS circuit group 47, and a /WE circuit group 49. The details of these circuits will be omitted in this specification.

Figure 2:
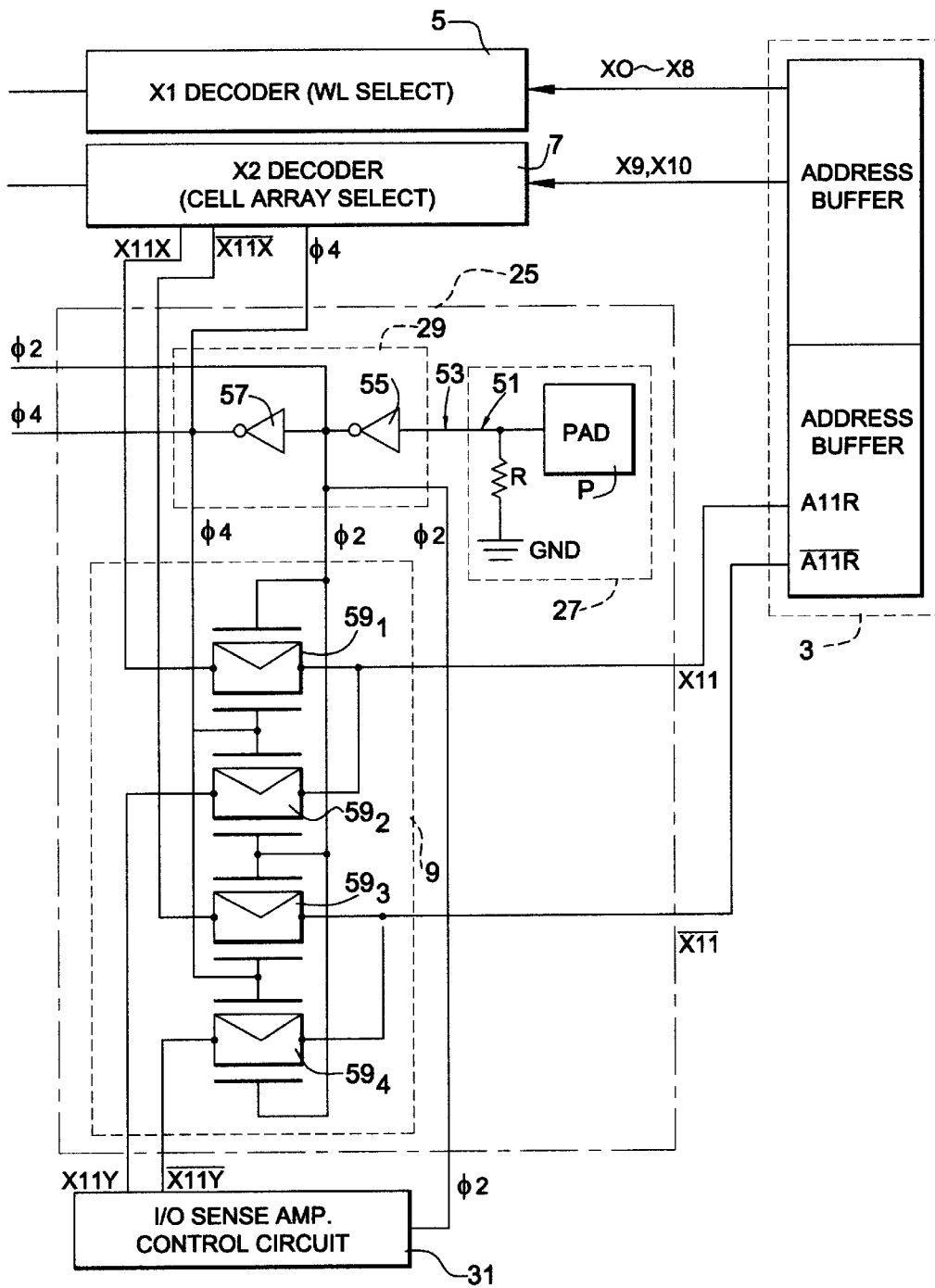
FIG. 2 is a circuit diagram of the product specification deciding circuit of FIG. 1.

FIG. 2 is a circuit diagram showing a concrete construction of the product specification deciding section 25.

As shown in FIG. 2, the receiving section 27 is composed of a pad P connected to the output terminal 51, and a resistance one end of which is connected to the junction point of the output terminal 51 and pad P and the other end of which is connected to the ground GND. This section 27 allows the output terminal 51 to be set to either a H (high) level or a L (low) level depending on whether a wire applied with a high potential VCC is bonded to the pad P (the decision signal SDS is in the H-level) or not (the signal SDS is in the L-level). The output terminal 51 is connected to the input terminal 53 of the switching signal generator section 29.

The switching signal generator section 29 is made up of a first inverter 55 whose input is connected to the input terminal 53, and a second inverter 57 whose input is connected to the output of the first inverter 55. The output of the inverter 55 is extracted as a first refresh switching signal $\phi 2$, and the output of the inverter 57 is extracted as a second refresh switching signal $\phi 4$.

The address switching section 9 is composed of switches (transfer gates) $59_1$ to $59_4$ consisting of n-channel MOSFET (hereinafter, referred to as NMOS) and p-channel MOSFET (hereinafter, referred to as PMOS) whose gates are supplied with switching signals $\phi 2$ or $\phi 4$. The X-address buffer group 3 supplies an address signal $A_{11R}$ ($X_{11}$) and its inverted signal $/A_{11R}$ ($/X_{11}$). The address signal $A_{11R}$ ($X_{11}$) is supplied to one end of each of switches $59_1$ and $59_2$. The other end of switch $59_1$ is connected to the X2-decoder 7, and the other end of the switch $59_2$ is connected to the I/O sense amplifier control circuit 31. The inverted signal $/A_{11R}$ ($/X_{11}$) is supplied to one end of each of switches $59_3$ and $59_4$. The other end of switch $59_3$ is connected to X2-decoder 7, and the other end of switch $59_4$ is connected to the I/O sense amplifier control circuit 31.

The gate of each of the PMOS of switch $59_1$, NMOS of switch $59_2$, PMOS of switch $59_3$, and NMOS of switch $59_4$ is all connected to the output of the inverter 55. The gate of each of the NMOS of switch $59_1$, PMOS of switch $59_2$, NMOS of switch $59_3$, and PMOS of switch $59_4$ is all connected to the output of the inverter 57.

Connecting this way allows either a pair of switches $59_1$ and $59_3$ or a pair of switches $59_2$ and $59_4$ to be selected and operated. For example, when the output of inverter 55 is in the H-level and the output of inverter 57 is in the L-level (in the case of the 2-kcycle refresh product), the switches $59_2$ and $59_4$ turn on, and address signal $A_{11R}$ and its inverted signal $/A_{11R}$ are supplied as addresses $X_{11Y}$ and $/X_{11Y}$ to the I/O sense amplifier control circuit 31.

Contrarily, when the output of inverter 55 is in the L-level and the output of inverter 57 is in the H level (in the case of the 4-kcycle refresh product), the switches $59_1$ and $59_3$ turn on, and address signal $A_{11R}$ and its inverted signal $/A_{11R}$ are supplied as addresses $X_{11X}$ and $/X_{11X}$ to the X2-decoder 7.

As noted above, the product specification deciding section 25, depending on whether to bond a wire applied with a high voltage VCC to the pad P or not, switches address signal $A_{11R}$ and its inverted signal $/A_{11R}$ either to the X2-decoder 7 or to the I/O sense amplifier control circuit 31.

Figure 3:
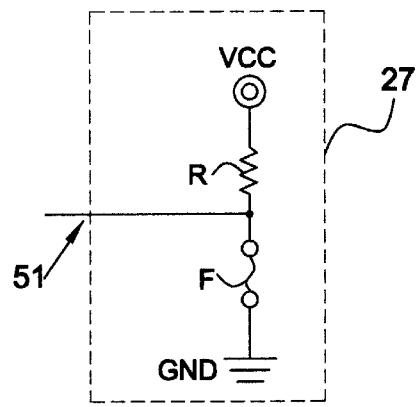
FIG. 3 is a circuit diagram of another example of the receiving section of FIG. 2.

FIG. 3 is a circuit diagram showing another construction of the receiving section 27.

The receiving section 27 of FIG. 2 may be constructed as shown in FIG. 3. Specifically, one end of the resistance R is connected to the high potential VCC, and the other end of the resistance R is connected to one end of the fuse F, the other end of which is connected to the ground GND. The junction point of the resistance R and fuse F is connected to the output terminal 51.

In the receiving section 27 thus constructed, cutting the fuse F enables the output terminal 51 to be set to the H-level, and uncutting the fuse F allows the output terminal 51 to be set to the L-level. The receiving section 27 of FIG. 3 operates in the same manner as that of FIG. 2.

Figure 4:
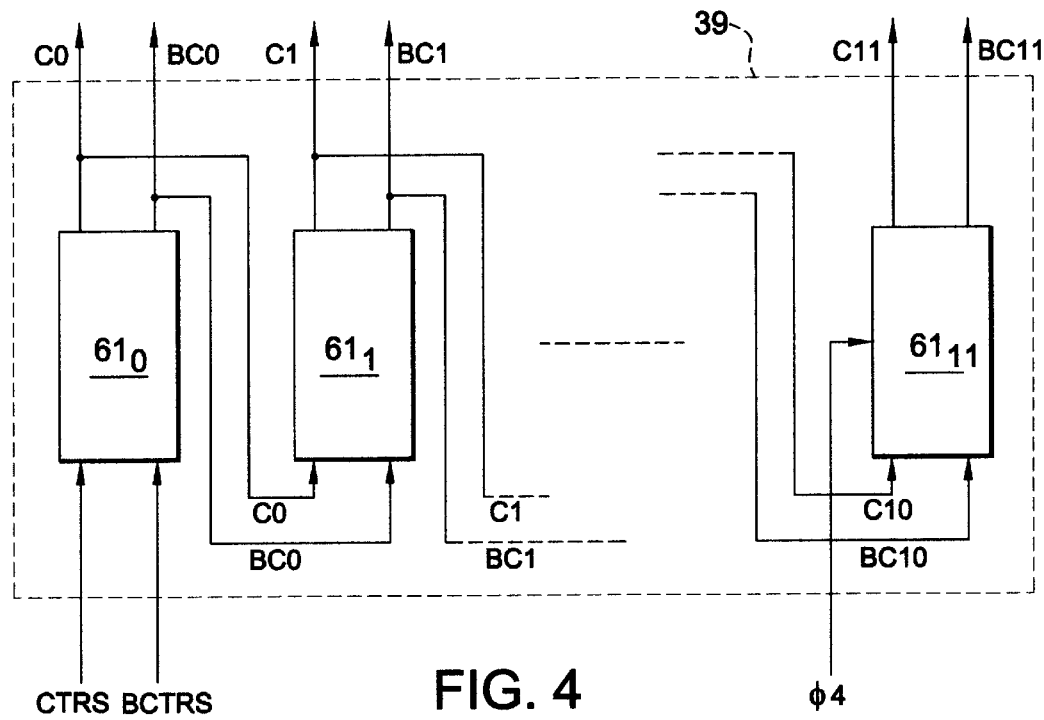
FIG. 4 is a block diagram of the counter circuit of FIG. 1.

FIG. 4 is a block diagram of the counter circuit 39 of FIG. 1.

As shown in FIG. 4, the counter circuit 39 is composed of counters $61_0$ to $61_{11}$. The least-significant counter $61_0$ is supplied with the signal CTRS commanding the count start and its inverted signal BCTRS. The counter $61_0$, based on the signal CTRS and its inverted signal BCTRS, supplies a counter output signal $C_0$ and its inverted signal $BC_0$. The counter $61_1$ in the next stage is supplied with the output (signal $C_0$ and its inverted signal $BC_0$) of the counter $61_0$ in the preceding stage. The counter $61_1$, based on the signal $C_0$ and its inverted signal $BC_0$, supplies a counter output signal $C_1$ and its inverted signal $BC_1$. In this way, counters $61_0$ to $61_{11}$ take in the outputs of the preceding stages, respectively, and based on the signals taken in, supply signals $C_1$ to $C_{11}$ and their inverted signals $BC_1$ to $BC_{11}$ in sequence. The most-significant counter $61_{11}$ is supplied with the output (signal $C_{10}$ and its inverted signal $BC_{10}$) of the counter $61_{10}$ in the preceding stage (not shown) and switching signal $\phi 4$. The counter $61_{11}$, only when, for example, supplied with the H-level switching signal $\phi 4$ (in the case of the 4-kcycle refresh product), supplies counter output signal $C_{11}$ and its inverted signal $BC_{11}$ on the basis of signal $C_{10}$ and its inverted signal $BC_{10}$. The counter $61_{11}$, when, for example, supplied with the L-level switching signal $\phi 4$ (in the case of the 2-kcycle refresh product), supplies neither signal $C_{11}$ nor its inverted signal $BC_{11}$. Thus, for the 2-kcycle refresh product, the output of the counter $61_{11}$ is ignored.

Figure 5A:
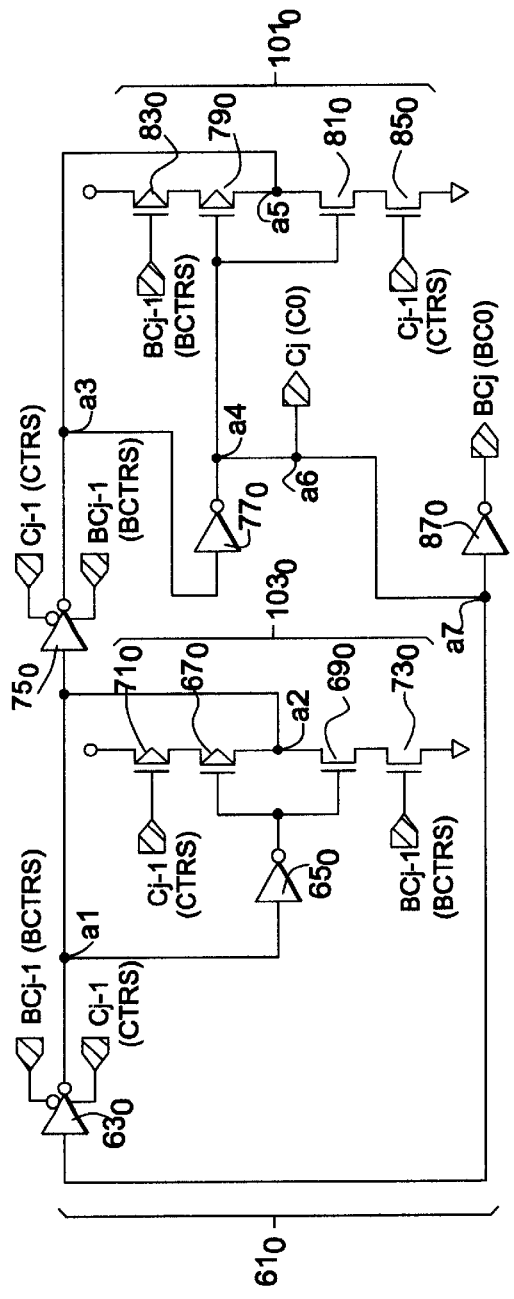
Figure 5B:
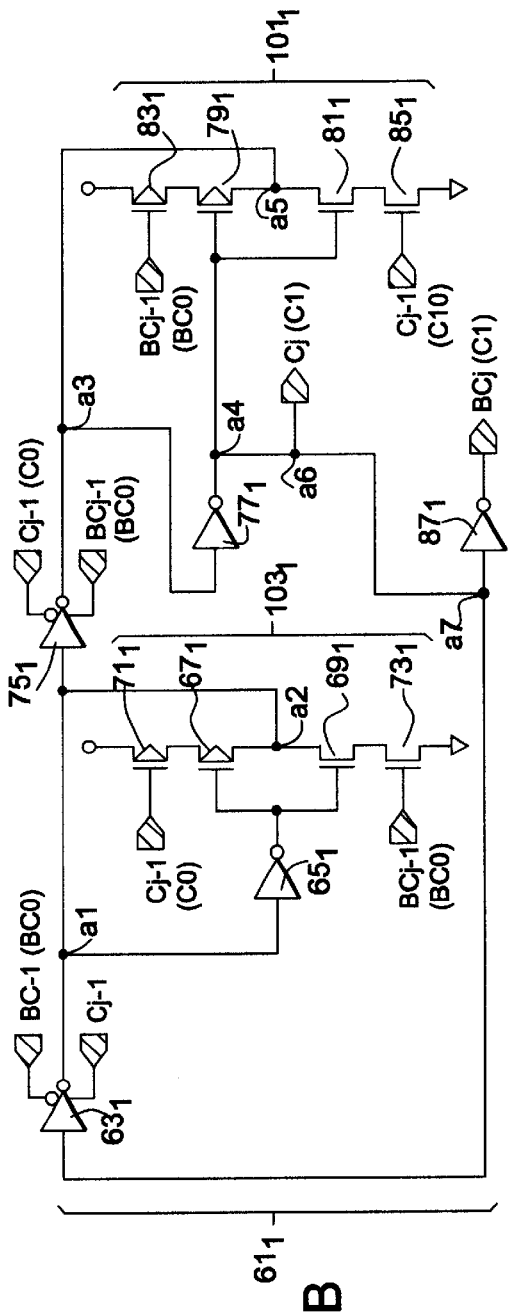

FIGS. 5A to 5C are a circuit diagram showing a concrete construction of the counters of FIG. 4.

The circuit configuration of each of counters $61_0$ to $61_{10}$ is the same, so that only counters $61_0$ and $61_1$ and the most-significant counter $61_{11}$ will be described.

FIGS. 5A and 5B are circuit diagrams of counters $61_0$ and $61_1$, respectively.

As shown in FIG. 5A, the output of the clocked inverter $63_0$ is connected to the input of the inverter $65_0$ (node a1). The output of inverter $65_0$ is connected to the gate of each of PMOS $67_0$ and NMOS $69_0$. The drain of PMOS $67_0$ is connected to that of NMOS $69_0$ (node a2). The source of PMOS $67_0$ is connected to the drain of PMOS $71_0$, and the source of PMOS $71_0$ is connected to a high potential power supply. The gate of PMOS $71_0$ is supplied with signal CTRS. The source of NMOS $69_0$ is connected to the drain of NMOS $73_0$, and the source of NMOS $73_0$ is connected to a low potential power supply (for example, the ground). The gate of NMOS $73_0$ is supplied with the inverted signal BCTRS. Node a2 is connected to node a1 as well as to the input of the clocked inverter $75_0$, which is driven by the clock opposite in phase to that of the clocked inverter $63_0$. The output of the clocked inverter $75_0$ is connected to the input of the inverter $77_0$ (node a3). The output of the inverter $77_0$ is connected to the gate of each of PMOS $79_0$ and NMOS $81_0$ (node a4). The drain of PMOS $79_0$ is connected to that of NMOS $81_0$ (node a5). The source of PMOS $79_0$ is connected to the drain of PMOS $83_0$, and the source of PMOS $83_0$ is connected to a high potential power supply. The gate of PMOS $83_0$ is supplied with the inverted signal BCTRS. The source of NMOS $81_0$ is connected to the drain of NMOS $85_0$, whose source is connected to a low potential power supply (for example, the ground). The gate of NMOS $85_0$ is supplied with the signal CTRS. Node a5 is connected to node a3. Node a4 is connected to the counter output signal terminal Cj ($C_0$) (node a6). Node a6 is connected to the input of the inverter $87_0$ (node a7). The output of inverter $87_0$ is connected to the inverted counter output signal terminal BCj ($BC_0$). Node a7 is connected to the input of inverter $63_0$. Explanation of FIG. 5B will be omitted. The construction of FIG. 5B is almost the same as that of FIG. 5A except for input signals (Cj-1, BCj-1) and output signals (Cj, BCj).

The most-significant counter $61_{11}$ will be explained.

As shown in FIG. 5C, node a2 is connected to the gate of PMOS $89_{11}$ (node a8) as well as to the gate of NMOS $91_{11}$. Node a8 is connected to node a1. The drain of PMOS $89_{11}$ is connected to the source of PMOS $93_{11}$. The source of PMOS $89_{11}$ is connected to a high potential power supply. The gate of PMOS $93_{11}$ is connected to signal CJ-1 ($C_{10}$). The drain of NMOS $91_{11}$ is connected to the source of NMOS $95_{11}$, which is also connected to the drain of NMOS $97_{11}$. The gate of NMOS $95_{11}$ is supplied with the inverted signal BCj-1 ($C_{10}$). The drain of PMOS $93_{11}$ is connected to that of NMOS $95_{11}$ (node a9). Node a9 is connected to the drain of PMOS $99_{11}$ whose source is connected to a high potential power supply. The gate of each of PMOS $99_{11}$ and NMOS $97_{11}$ is supplied with switching signal $\phi 4$. Node a9 is connected to node a3.

The operation of the counter of FIG. 5 will be explained.

It is assumed that the first stage counter $61_0$ is supplied with signal Cj-1 (CTRS) and inverted signal BCj-1 (BCTRS), and that the clocked inverter $63_0$ and the clocked inverter $101_0$ made up of PMOS $79_0$ and PMOS $83_0$ and NMOS $81_0$ and NMOS $85_0$ are turned on. In this state, the clocked inverter $75_0$ and the clocked inverter $103_0$ made up of PMOS $67_0$ and PMOS $71_0$ and NMOS $69_0$ and NMOS $73_0$ are in the off state because they are supplied with the clock opposite in phase to that of the clocked inverter $63_0$. As a result, a latch circuit composed of the inverter $77_0$ and clocked inverter $101_0$ latches a signal that brings node a4 to the H-level. This allows the counter output signal terminal Cj to supply the H-level signal ($C_0$), and the inverted counter output signal terminal BCj to supply the L-level signal ($BC_0$). When the level of the clock signal is inverted, the clocked inverters $63_0$ and $101_0$ are turned off and the clocked invertors $75_0$ and $103_0$ are turned on. As a result, a latch circuit composed of the inverter $65_0$ and clocked inverter $103_0$ latches a signal that brings node a2 to the L-level. When node a2 is in the L-level, the clocked inverter $75_0$ supplies the H-level signal, bringing node a4 to the L-level. Therefore, the counter output signal terminal Cj supplies the L-level signal ($C_0$) opposite in level to that of the signal described above, and the inverted counter output signal terminal BCj supplies the H-level signal ($BC_0$) whose signal level has been inverted. The next-stage counter $61_1$ is supplied with the output signals $C_0$ and $BC_0$ and driven by them. The subsequent counters $61_2$ to $61_{10}$ operate the same way. The eleventh-stage counter $61_{10}$ supplies signals $C_{10}$ and $BC_{10}$, which are used to drive the final counter $61_{11}$. In the counter $61_{11}$, a low potential is supplied via NMOS $97_{11}$ to the clocked inverter $75_{11}$ made up of PMOS $89_{11}$, PMOS $93_{11}$, NMOS $91_{11}$, and NMOS $95_{11}$. The gate of NMOS $97_{11}$ is supplied with the switching signal φ4. Because the L-level switching signal turns off NMOS $97_{11}$, the clocked inverter $75_{11}$ does not operate. Thus, the counter $61_{11}$ supplies effective counter output signal $C_j$ ($C_{11}$) and inverted output signal BCj ($BC_{11}$) only when the switching signal is in the H-level.

FIGS. 6A and 6B are circuit diagrams showing a concrete construction of the word-line boosting section 41 of FIG. 1.

As shown in FIG. 6A, the word-line boosting section 41 contains a first boosting capacitor $105_1$ and second boosting capacitor $105_2$. One electrode of each of the first and second boosting capacitors $105_1$ and $105_2$ is connected to the boosting line 43. The line 43 is connected to the boosting driving circuit $15_0$ to $15_7$ shown in FIG. 1. The other electrode of capacitor $105_1$ is connected to the output of the first word-line boosting circuit $107_1$, and the other electrode of capacitor $105_2$ is connected to the output of the second word-line boosting circuit $107_2$. The input of the first word-line boosting circuit $107_1$ is supplied with a boosting signal φWL. The input of the second word-line boosting circuit $107_2$ is connected to the output of the AND gate (logical product gate) 109. The input of AND gate 109 is supplied with the signal φWL and switching signal φ2. Each of the boosting circuits $107_1$ and $107_2$ is composed of two inverters connected in series between the input and output.

The operation of the word-line boosting section 41 of FIG. 6 will be explained. When both the boosting signal φWL and switching signal φ2 are in the H-level (in the case of the 2-kcycle product), both boosting circuits $107_1$ and $107_2$ are activated. When the switching signal φ2 is in the L-level (in the case of the 4-kcycle product), only the boosting circuit $107_1$ is activated. Thus, the boosting section 41 of the 2-kcycle product supplies a higher boosting capacitance than that of the 4-kcycle product.

As shown in FIG. 6B, the step-up section 41 may be made up of the boosting circuit $107_2$ connected between the input and output with the input being connected to a NAND gate 111. The boosting section 41 of FIG. 6B operates in the same manner as the boosting section 41 of FIG. 6A.

Figure 7:
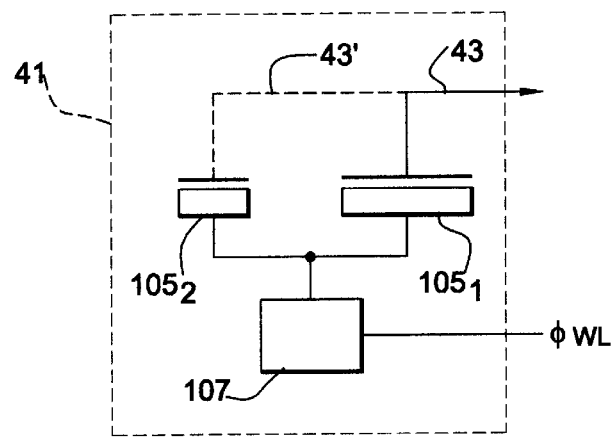
FIG. 7 is a circuit diagram of another example of the word-line step-up section of FIG. 1.

FIG. 7 is a block diagram showing another construction of the word-line boosting section 41.

As shown in FIG. 7, the boosting line 43 connected to the second boosting capacitor $105_2$ may be prepared as a mask option. Specifically, in the manufacturing processes, the conducting layer patterning of the boosting line 43 may be designed to allow selection of a mask with the pattern of boosting line 43 connected only to the first boosting capacitor $105_1$ or a mask with the pattern of boosting line 43' connected to the second boosting capacitor $105_2$ in addition to that of the first one.

Figure 8:
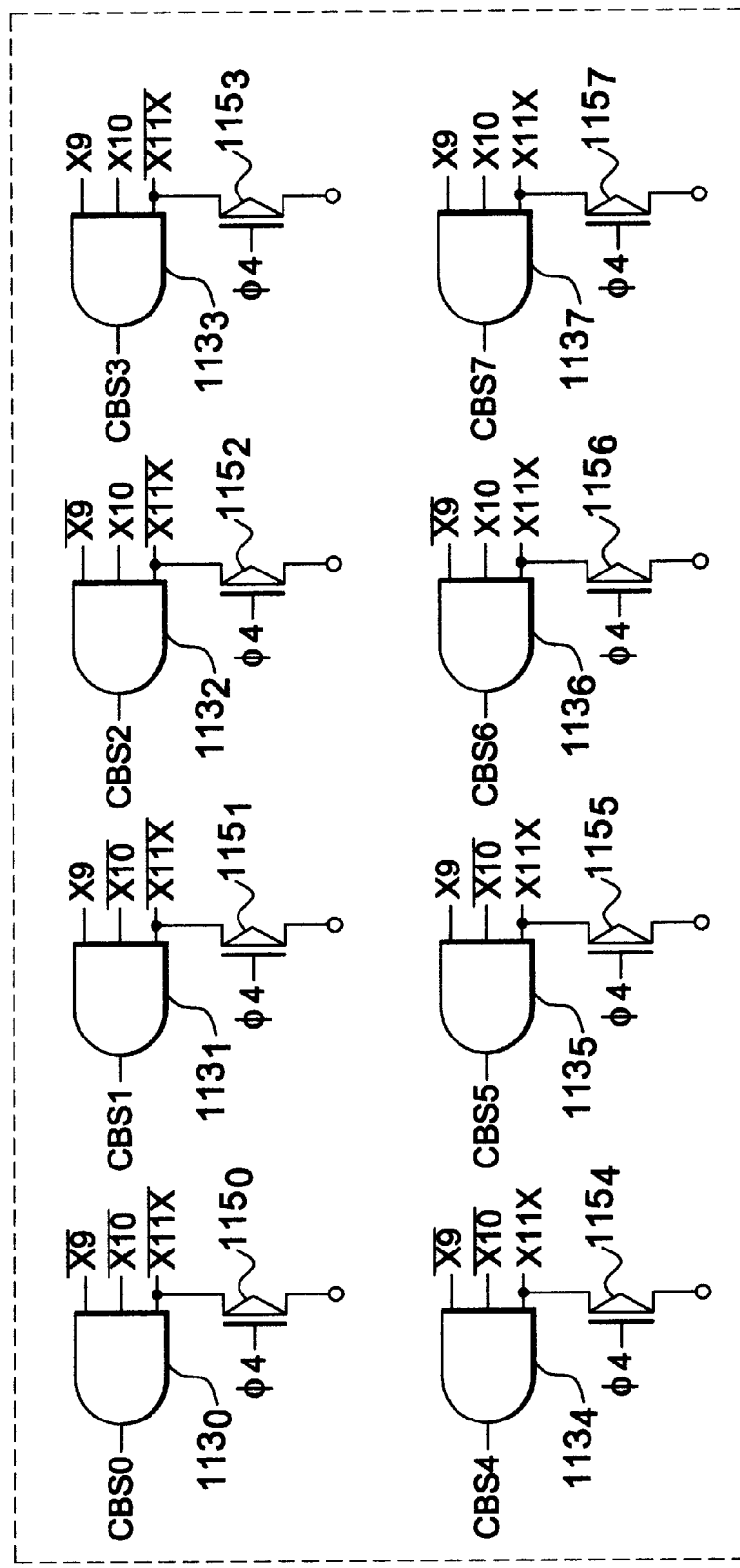
FIG. 8 is a circuit diagram of the X2-decoder of FIG. 1.

FIG. 8 is a circuit diagram showing a concrete construction of the X2-decoder 7 of FIG. 1.

AND gates $113_0$ to $113_7$ are provided as shown in FIG. 8. The inputs of AND gates $113_0$ to $113_7$ are supplied with the second addresses $X_9$ (/$X_9$) and $X_{10}$ (/$X_{10}$) and the third address $X_{11x}$ (/$X_{11x}$) in a different combination. The third address inputs of AND gates $113_0$ to $113_7$ are connected to either the sources or drains of PMOS $115_0$ to PMOS $115_7$. The gates of PMOS $115_0$ to PMOS $115_7$ are supplied with the switching signal φ4. The outputs CBS0 to CBS7 of AND gates $113_0$ to $113_7$ are extracted as cell array block select signals.

The operation of X2-decoder 7 will be explained. When the switching signal φ4 is in the L-level (in the case of the 2-kcycle product), PMOS $115_0$ to PMOS $115_7$ are each turned on, causing the third address input to remain at the H-level. Therefore, the third X-address input ($X_{11X}$ and /$X_{11X}$) is ignored. When the switching signal φ4 is in the H-level (in the case of the 4-kcycle product), PMOS $115_0$ to PMOS $115_7$ are each turned off, activating the third X-address input. As a result, AND gates $113_0$ to $113_7$ take in addresses $X_{11X}$ and /$X_{11X}$.

Figure 9:
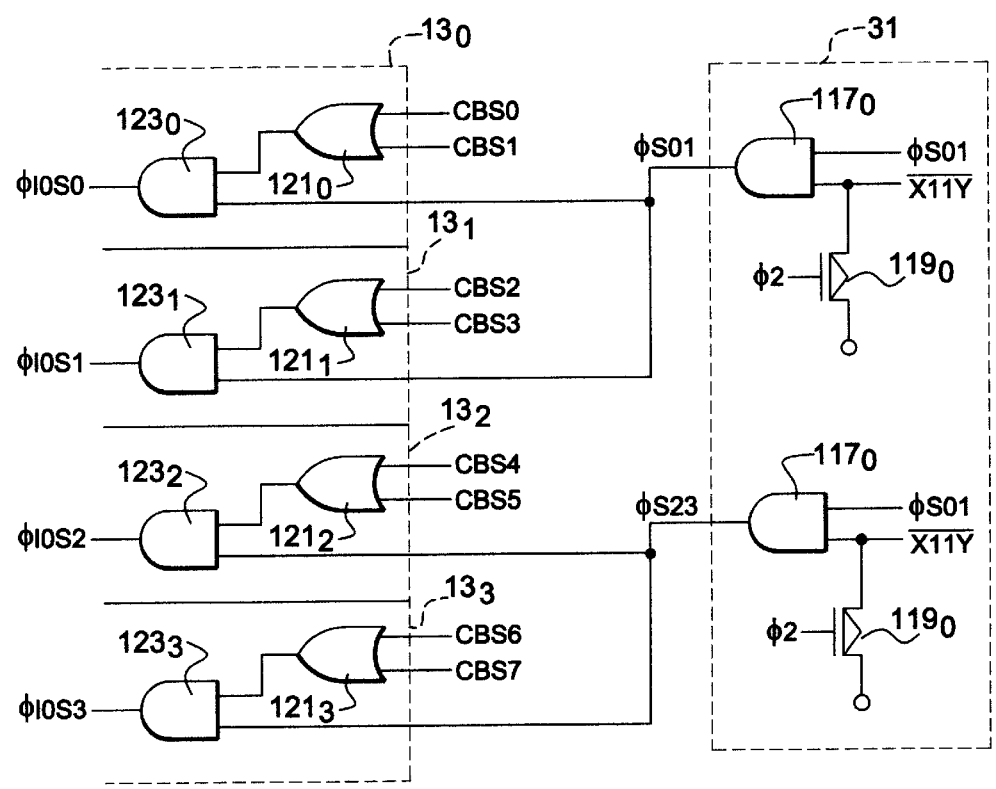
FIG. 9 is a circuit diagram of the I/O sense amplifier group and I/O sense amplifier control circuit of FIG. 1.

FIG. 9 is a circuit diagram showing a concrete construction of the I/O sense amplifier group 13 and I/O sense amplifier control circuit 31 shown in FIG. 1.

As shown in FIG. 9, the I/O sense amplifier control circuit 31 contains AND gates $117_0$ and $117_1$. Each of AND gates $117_0$ and $117_1$ is supplied with the I/O sense timing signal φ$_{IOS}$ and address $X_{11Y}$ and /$X_{11Y}$. The third X-address input of each of AND gates $117_0$ and $117_1$ is connected to the sources or drains of PMOS $119_0$ and PMOS $119_1$. The gates of PMOS $119_0$ and PMOS $119_1$ are supplied with the switching signal φ2. The outputs φ$_{S01}$ and φ$_{S23}$ of gates $117_0$ and $117_1$ are extracted as the I/O sense amplifier group select signals to select the I/O sense amplifier groups $13_0$ to $13_3$.

The operation of the I/O sense amplifier control circuit 31 will be explained.

When the switching signal φ2 is in the L-level (in the case of the 4-kcycle product), PMOS $119_0$ to PMOS $119_7$ are each turned on, causing the third X-address input to remain at the L-level. Therefore, the third X-address input ($X_{11Y}$ and /$X_{11Y}$) is ignored. When the switching signal φ2 is in the H-level (in the case of the 2-kcycle product), PMOS $119_0$ and PMOS $119_1$ are each turned off, activating the third X-address input. As a result, AND gates $117_0$ to $117_1$ take in addresses $X_{11Y}$ and /$X_{11Y}$.

FIG. 9 shows a primary portion of the I/O sense amplifier groups $13_0$ to $13_3$.

As shown in FIG. 9, the I/O sense amplifier groups $13_0$ to $13_3$ are each made up of OR gates $121_0$ to $121_3$ and AND gates $123_0$ to $123_3$. The inputs of OR gates $121_0$ to $121_3$ are supplied with block select signals CBS0 to CBS7. The inputs of AND gates $123_0$ to $123_3$ are supplied with the outputs of OR gates $121_0$ to $121_3$, and I/O sense amplifier select signals φ$_{S01}$ and φ$_{S23}$. The outputs of AND gates $123_0$ to $123_3$ are extracted as I/O sense timing signals φ$_{IOS0}$ and φ$_{IOS3}$.

A second embodiment of the present invention will be explained.

Figure 10:
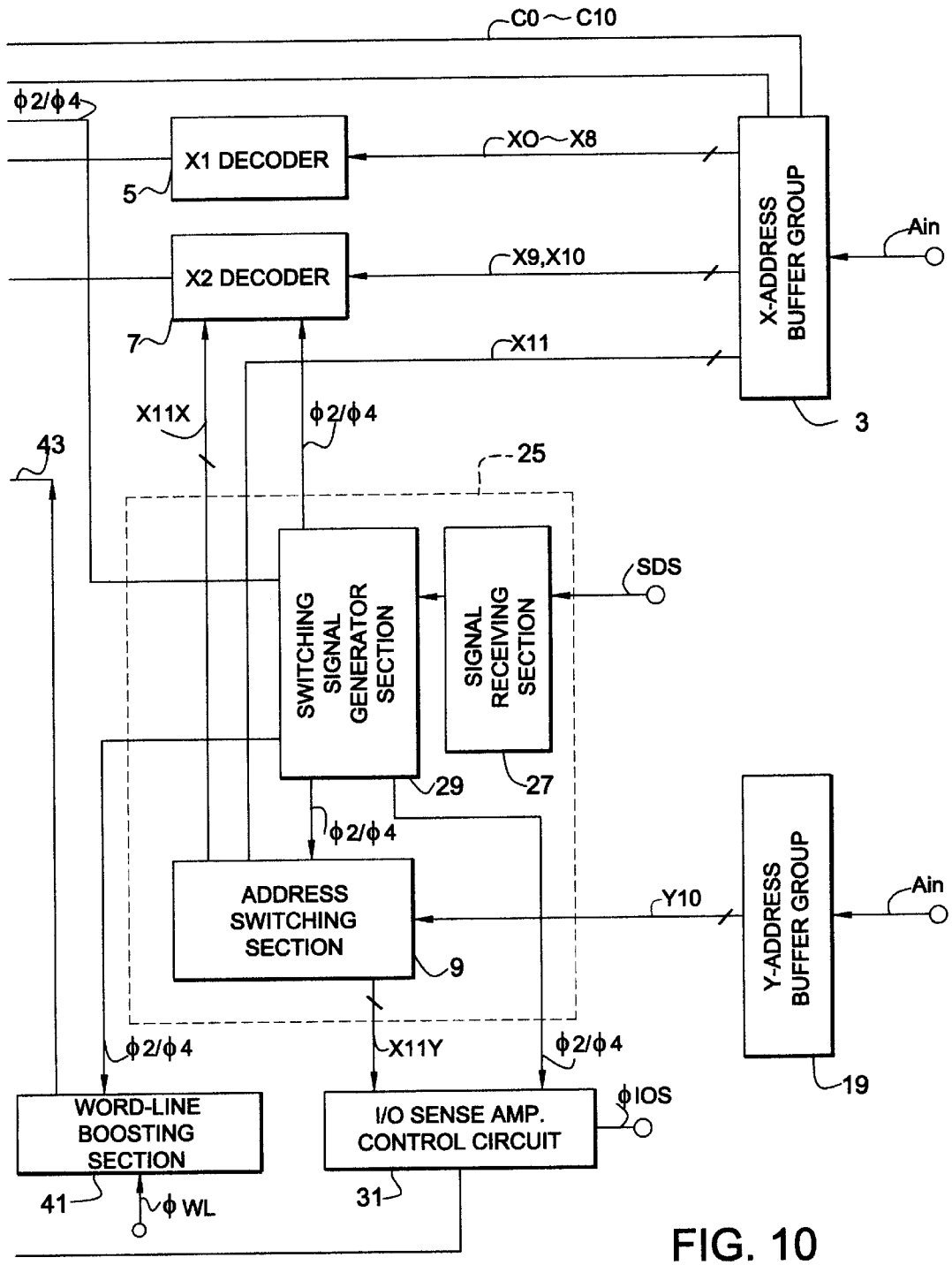
FIG. 10 is a block diagram of a DRAM according to a second embodiment of the present invention.

FIG. 10 is a block diagram of a DRAM according to the second embodiment of the present invention. This figure centers especially on the product specification deciding section 25. The DRAM shown in FIG. 1 is a device where the X-address allocating method is the same as the Y-address allocating method, such as a DRAM of a x1 bit construction. Two types of products with different refresh-cycles can be obtained from a single DRAM of FIG. 1.

In some devices, however, as the refresh cycle changes, the X-address allocation and Y-address allocation change accordingly. They include x4 bit DRAMs, x8 bit DRAMs, and x16 bit DRAMs, or multi-bit DRAMs. In the multi-bit DRAM, as the refresh-cycle changes, the number of X-addresses and that of Y-addresses change. Therefore, to realize several types of products with different refresh-cycles, it is necessary to change the allocation of X-addresses and Y-addresses according to the difference in refresh cycle. A DRAM according to the second embodiment is a device that allows the change of address allocation depending on the difference in refresh-cycle.

FIG. 10 is a block diagram of a x4 bit DRAM. In a DRAM of x4 bits with 2k-refresh cycles, the number of X-addresses is equal to that of Y-addresses, or their address are symmetrical. For example, X-addresses range from $X_0$ to $X_{10}$, and Y-addresses range from $Y_0$ to $Y_{10}$. In a DRAM of x4 bits with 4k-refresh-cycles, the number of X-addresses differ from that of Y-addresses, or their addresses are asymmetrical. For example, X-addresses range from $X_0$ to $X_{11}$, and Y-addresses range from $Y_0$ to $Y_9$.

In the DRAM shown in FIG. 10, when the refresh-cycle is set to 4-kcycles, X-address $X_{11}$ is changed to address $X_{11X}$ at the address switching section 9, and then supplied to the X2-decoder 7. At this time, Y-address $Y_{10}$ is prevented from being supplied from the Y-address buffer group 19. A detailed description of this will be found in a later embodiment.

When the refresh cycle is set to 2-kcycles, Y-address $Y_{10}$ is changed to address $X_{11Y}$ at the address switching section 9, and then supplied to the I/O sense amplifier control circuit 31. At this time, X-address $X_{11}$ is prevented from being supplied from the X-address buffer group 3. As with Y-address $Y_{10}$, a detailed description of X-address $X_{11}$ will be found in a later embodiment.

Figure 11:
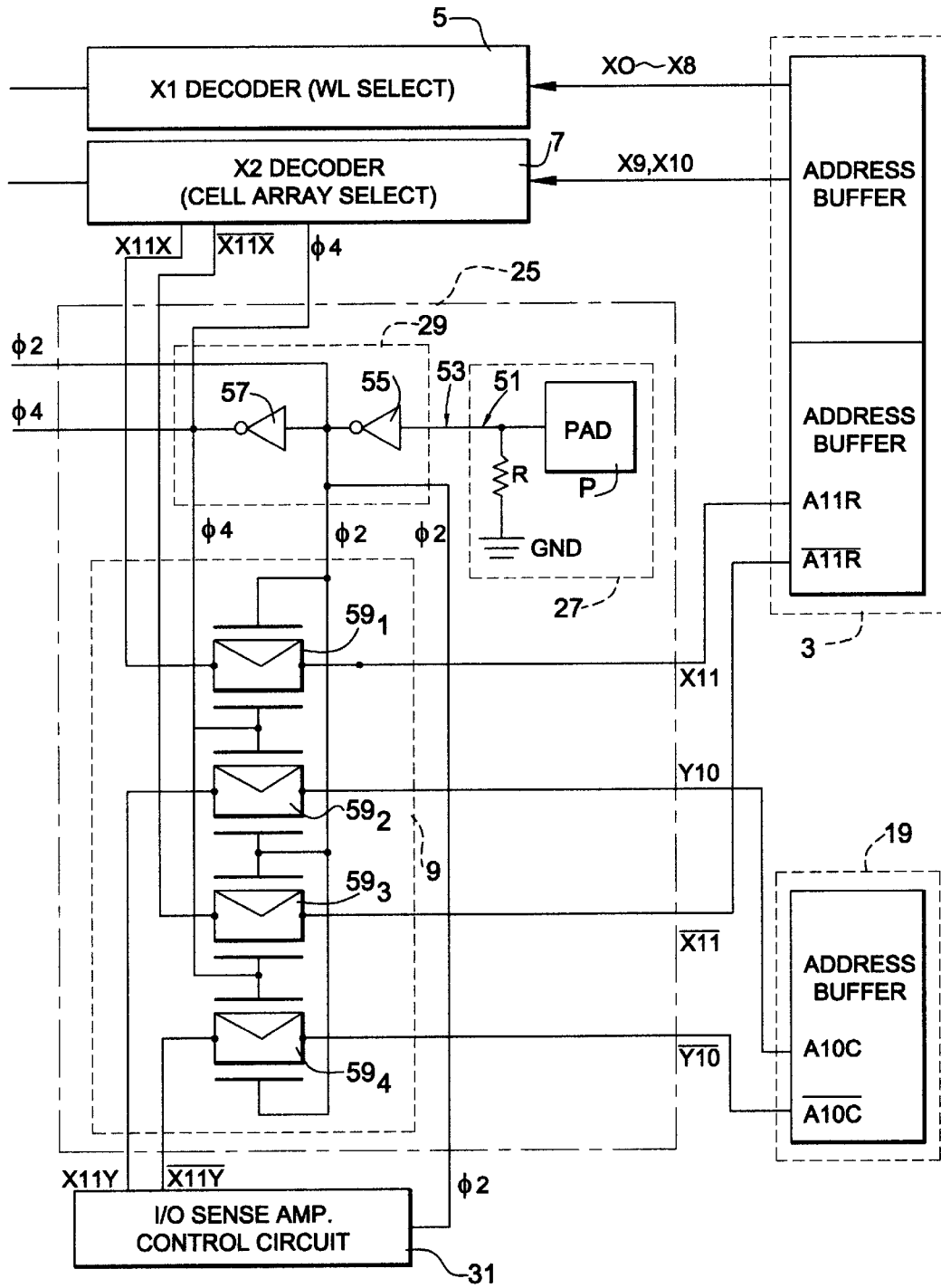
FIG. 11 is a circuit diagram of the product specification deciding circuit of FIG. 10.

FIG. 11 is a circuit diagram of the product specification deciding section 25 of FIG. 10.

As shown in FIG. 11, the address switching section 9 contains switches (transfer gates) $59_1$ to $59_4$ composed of NMOS and PMOS elements. X-addresses $X_{11}$ ($A_{11R}$) and /$X_{11}$ (/$A_{11R}$) are supplied to switches $59_1$ and $59_3$, respectively. Y-addresses $Y_{10}$ ($A_{10C}$) and /$Y_{10}$ (/$A_{10C}$) are supplied to switches $59_2$ and $59_4$, respectively. Thus, when the switching signal φ2 is in the H-level and the switching signal φ4 is in the L-level (in the case of the 2-kcycle-refresh product), Y-addresses $Y_{10}$ and /$Y_{10}$ are supplied as addresses $X_{11Y}$ and/$X_{11Y}$ to the I/O sense amplifier control circuit 31 via switches $59_2$ and $59_4$.

When the switching signal φ2 is in the L-level and the switching signal φ4 is in the H-level (in the case of the 4-kcycle refresh product), X-addresses $X_{11}$ and /$X_{11}$ are supplied as addresses $X_{11X}$ and /$X_{11X}$ to the X2-decoder 7 via switches $59_1$ and $59_3$.

The same reasoning may be applied to x8 bit and x16 bit devices.

A third embodiment of the present invention will be explained.

Figure 12:
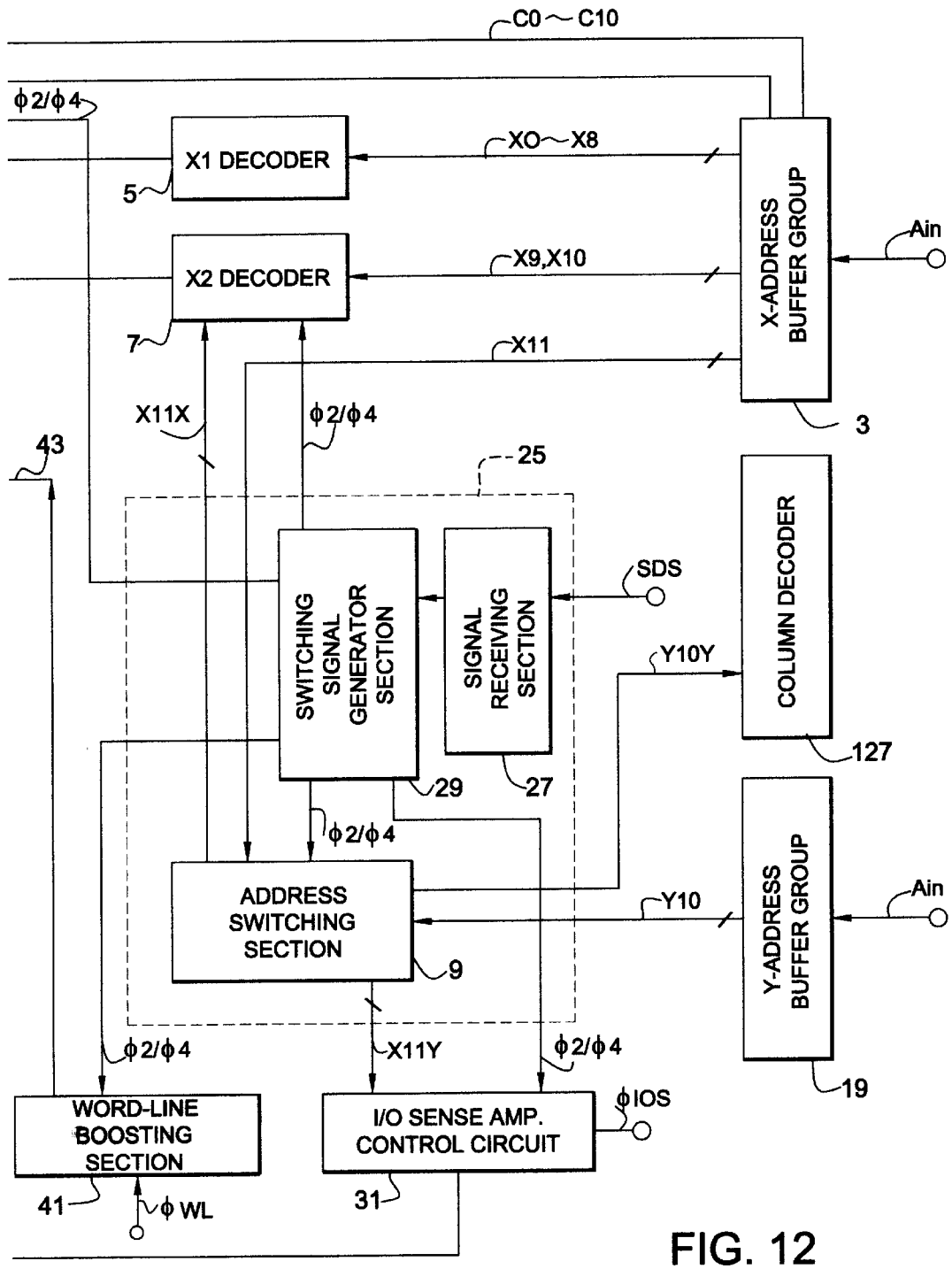
FIG. 12 is a block diagram of a DRAM according to a third embodiment of the present invention.

FIG. 12 is a block diagram of a DRAM according to the third embodiment. This figure centers primarily on the product specification deciding section 25. The DRAM of the third embodiment enables the change of refresh cycle as well as bit construction. For example, a single DRAM may be formed into four types of products: a x1 bit product at 2-kcycles, a x1 bit product at 4-kcycles, a x4 bit product at 2-kcycles, and a x4 bit product at 4-kcycles.

As shown in FIG. 12, the address switching section 9, based on the switching signals φ2 and φ4, supplies address $Y_{10Y}$ to the column decoder 127.

In the DRAM of FIG. 12, for a x1 bit construction at 2k-refresh cycles, the address switcing section 9, based on the switching signals φ2 and φ4, changes X-address signal $X_{11}$ to address $Y_{10Y}$ to supply the latter to the column decoder 127.

For a x1 bit construction at 4k-refresh cycles, the address switching section 9, based on the switching signals φ2 and φ4, changes Y-address signal $Y_{10}$ to address $Y_{10Y}$ to supply address $Y_{10Y}$ to the column decoder 127.

For a x4 bit construction at 2k-refresh cycles and a x4 bit construction at 4k-refresh cycles, the address switching section 9 is prevented from supplying address $Y_{10Y}$. An alternative to this is to connect between the address switching section 9 and the column decoder 127 a circuit that ignores address $Y_{10Y}$ based on the signal specifying a x4 bit construction.

In this way, by constructing the address switching section 9 so that for a x1 bit construction, address $Y_{10Y}$ may be produced from X-address or Y-address based on the switching signals φ2 and φ4, while for a x4 bit construction, address $Y_{10Y}$ may be ignored independently of the switching signals φ2 and φ4, it is possible to realize a DRAM that enables not only the change of refresh cycle but also that of bit construction.

Figure 13:
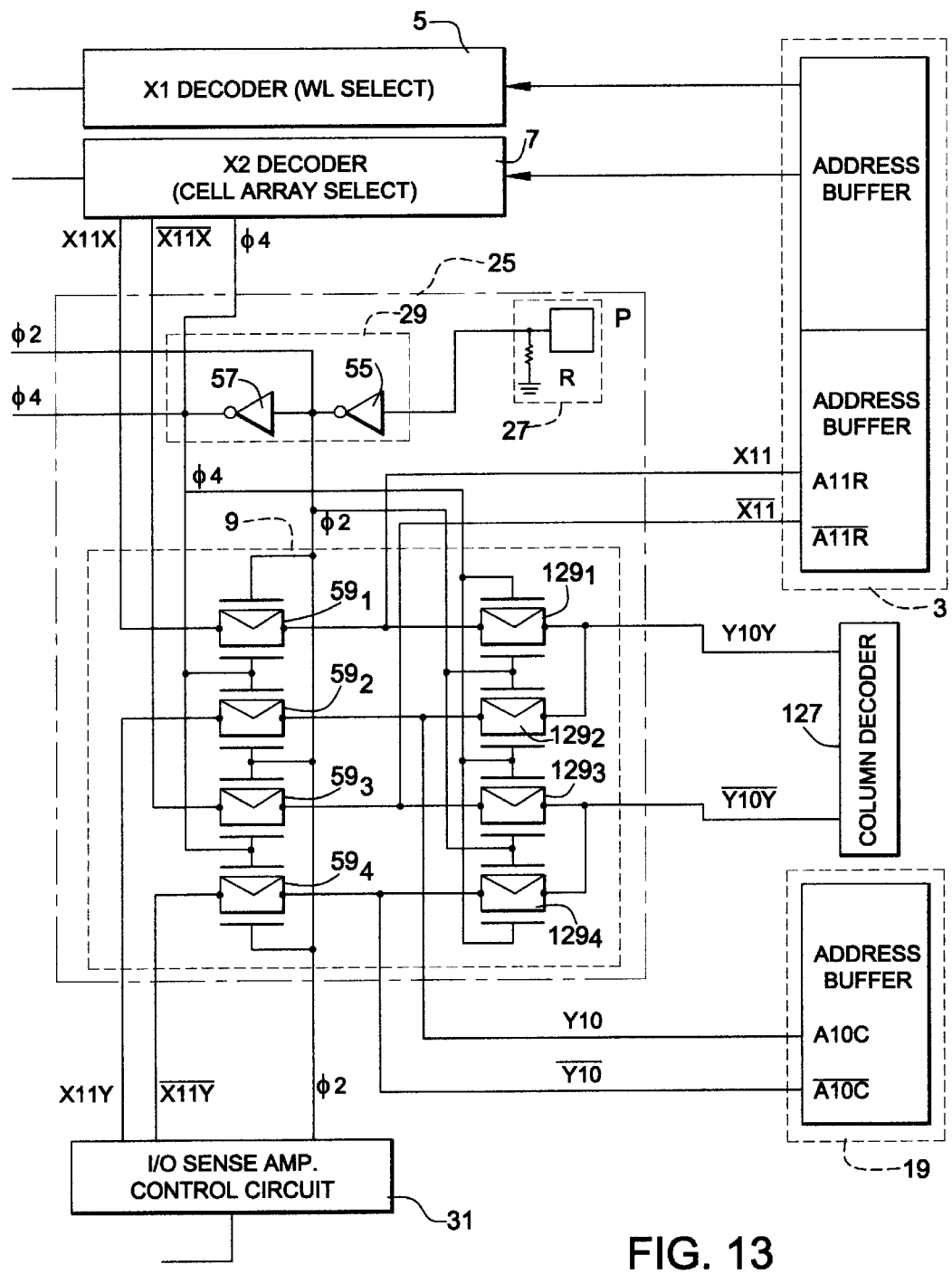
FIG. 13 is a circuit diagram of the product specification deciding circuit of FIG. 12.

FIG. 13 is a circuit diagram of the product specification deciding section 25 of FIG. 12.

As shown in FIG. 13, the address switching section 9 contains switches (transfer gates) $59_1$ to $59_4$ and switches $129_1$ to $129_4$ composed of NMOS and PMOS elements. X-address $X_{11}$ ($A_{11R}$) is supplied to switches $59_1$ to $129_1$. Similarly, the inverted X-address /$X_{11}$ (/$A_{11R}$) is supplied to switches $59_3$ and $129_3$; Y-address Y10 ($A_{10C}$) is supplied to switches $59_2$ to $129_2$; and the inverted /$Y_{10}$ (/$A_{10C}$) is supplied to switches $59_4$ and $129_4$. The switching signal φ4 is supplied to the gate of each of the NMOS of switch $59_1$, the PMOS of switch $59_2$, the NMOS of switch $59_3$, the PMOS of switch $59_4$, the PMOS of switch $129_1$, the NMOS of switch $129_2$, the PMOS of switch $129_3$, and the NMOS of switch $129_4$. The switching signal φ2 is supplied to the gate of each of the PMOS of switch $59_1$, the NMOS of switch $59_2$, the PMOS of switch $59_3$, the NMOS of switch $59_4$, the NMOS of switch $129_1$, the PMOS of switch $129_2$, the NMOS of switch $129_3$, and the PMOS of switch $129_4$.

With the product specification deciding section 25 of the above-described construction, when the switching signal φ2 is in the H-level and the switching signal φ4 is in the L-level (in the case of the 2-kcycle refresh product of x1 bits), switches $59_2$ and $59_4$ turn on, so that Y-addresses $Y_{10}$ and /$Y_{10}$ are supplied to the sense amplifier control circuit 31 via switches $59_2$ and $59_4$. Further, because switches $129_1$ and $129_3$ turn on, so that X-addresses $X_{11}$ and /$X_{11}$ are supplied to the column decoder 127 via switches $129_1$ and $129_3$.

When the switching signal φ2 is in the L-level and the switching signal φ4 is in the H-level (in the case of 4-kcycle refresh product of x1 bits), switches $59_1$ and $59_3$ turn on, so that X-addresses $X_{11}$ and /$X_{11}$ are supplied to the X2-decoder 7 via switches $59_1$ and $59_3$. Further, because switches $129_2$ and $129_4$ turn on, so that Y-addresses $Y_{10}$ and /$Y_{10}$ are supplied to the column decoder 127 via switches $129_2$ and $129_4$.

Between the address switching section 9 and column decoder is connected a circuit (not shown) that ignores addresses $Y_{10Y}$ and $/Y_{10Y}$ based on the signal specifying a x4 bit construction. To select a x4 bit construction, this circuit is used to prevent addresses $Y_{10Y}$ and $/Y_{10Y}$ from being supplied to the column decoder 127.

A fourth embodiment of the present invention will be explained.

Figure 14:
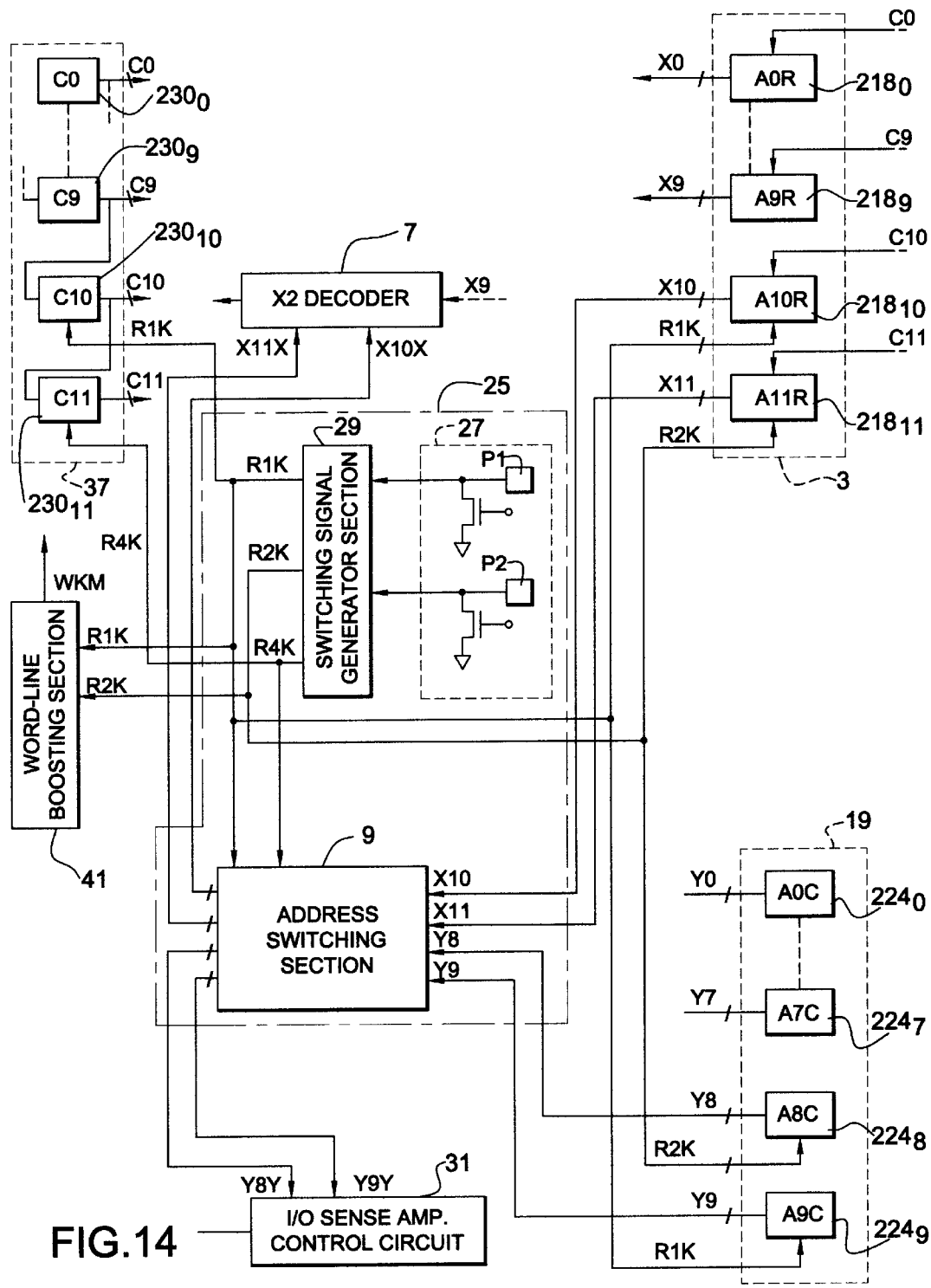
FIG. 14 is a block diagram of a DRAM according to a fourth embodiment of the present invention.

FIG. 14 is a block diagram of a DRAM according to the fourth embodiment. This figure centers primarily on the product specification deciding section 25. The DRAM of this embodiment allows the change of refresh cycle to more than two different cycles, for example, any of 1-kcycles, 2-kcycles, and 4-kcycles.

Figure 15:
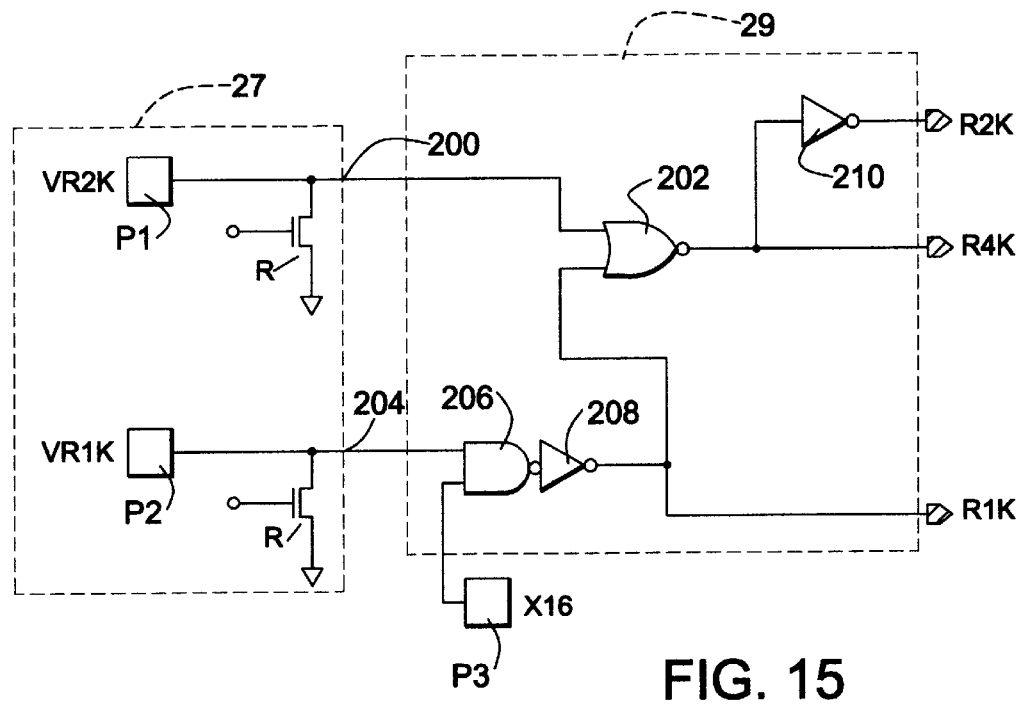
FIG. 15 is a circuit diagram of the receiving section and switching signal generator section of FIG. 14.

FIG. 15 is a circuit diagram of the receiving section 27 and switching signal generating section 29 of FIG. 14.

As shown in FIG. 15, the receiving section 27 contains two bonding pads P1 and P2. Pad P1 is supplied with a first product specification decision signal VR2K, and pad P2 with a second product specification decision signal VR1K. A first output terminal 200 connected to pad P1 is connected to a first input of a NOR gate 202. A second output terminal 204 connected to pad P2 is connected to a first input of a NAND gate 206. A second input of the NAND gate 206 is connected to bonding pad P3 supplied with the signal x16 determining the bit construction. To select a x16 bit construction, a H-level signal is supplied to pad P3. Supplying a L-level signal to pad P3 allows the formation of the product of a x8 bit construction. The output of a NAND gate 206 is connected to the input of an inverter 208. The output of the inverter 208 is extracted as a first switching signal R1K, and is connected to the second output of the NOR gate 202. The output of the NOR gate 202 is extracted as a third switching signal R4K as well as a second switching signal R2K via an inverter 210. As shown in FIG. 14, among these switching signals R1K, R2K, and R4K, the signals R1K and R4K are supplied to the address switching section 9 and counter circuit 37, while the signals R1K and R2K are supplied to the X-address buffer group 3, Y-address buffer group 19, and word-line step-up section 41.

Figures 20, 21, 22:
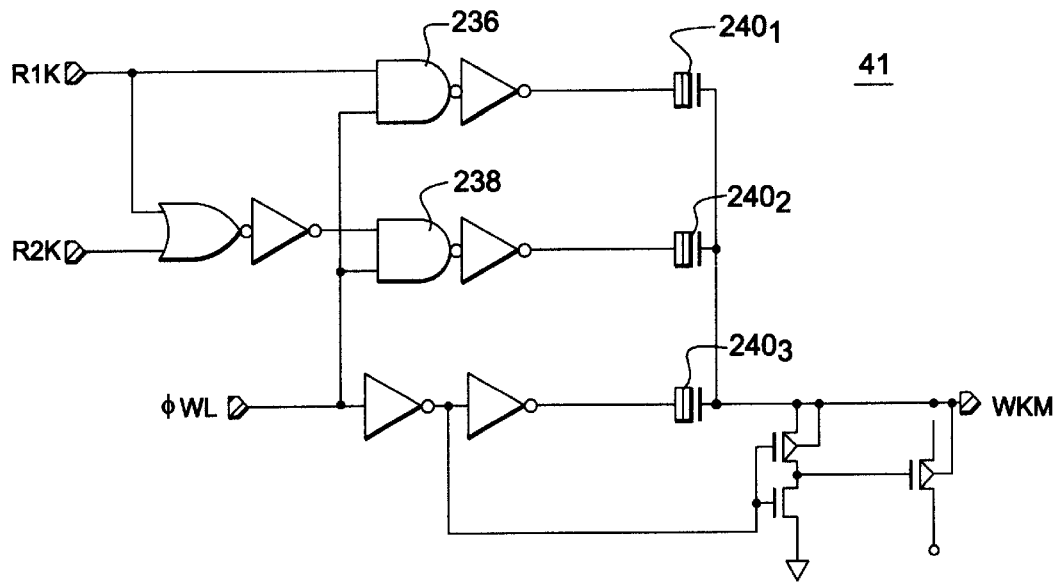
FIG. 20 is a circuit diagram of the word-line step-up section of FIG. 14.
FIG. 21 shows the logic of VR1K, VR2K, R1K, R2K and R4K for each refresh cycle.
FIG. 22 shows the destinations of outputs A and B for each refresh cycle.

FIG. 21 shows the logic of VR1K, VR2K, R1K, R2K and R4K for each refresh cycle in the case of the x16 bit product. In the figure, character H indicates a H-level signal, and L a L-level signal.

Figure 16:
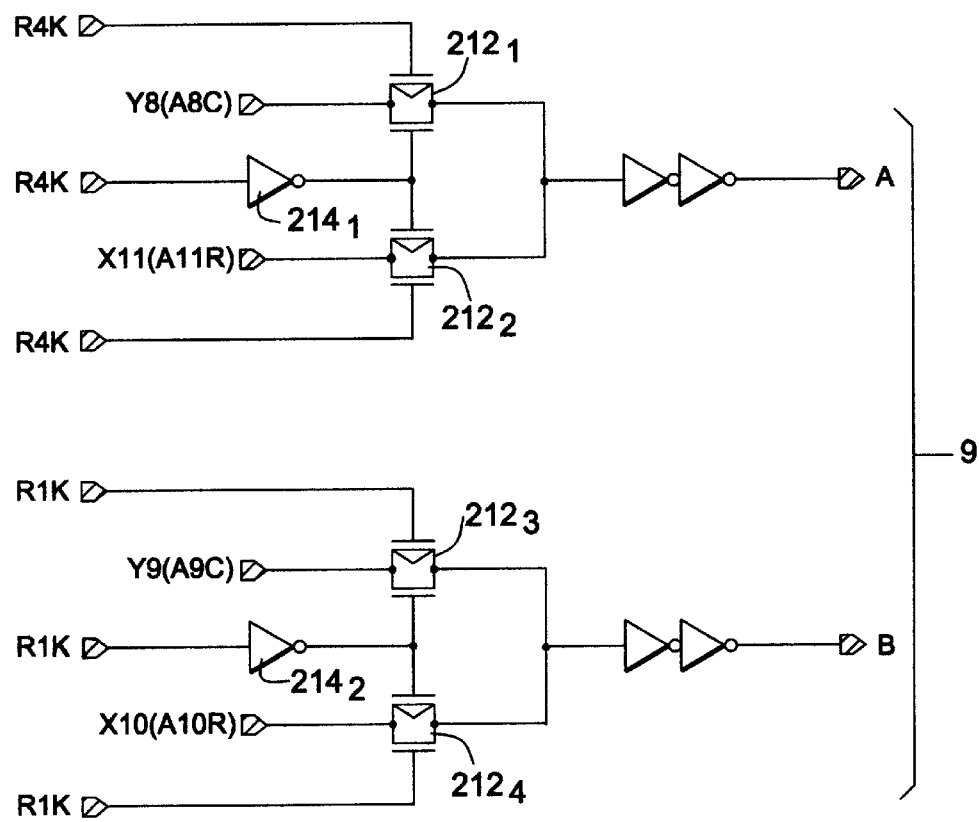
FIG. 16 is a circuit diagram of the address switching section of FIG. 14.

FIG. 16 is a circuit diagram of the address switching section 9 of FIG. 14.

As shown in FIG. 16, the address switching section 9 contains switches (transfer gates) $212_1$ to $212_4$ composed of NMOS and PMOS elements. The switch $212_1$ is supplied with Y-address Y8 (A8C). Similarly, the switch $212_2$ is supplied with X-address $X_{11}$ (A11R); switch $212_3$ with Y-address $Y_9$ (A9C); and switch $212_4$ with X-address $X_{10}$ ($X_{10R}$). The third switching signal R4K is supplied to the gate of each of the PMOS of switch $212_1$ and the NMOS of switch $212_2$. The switching signal R4K is also supplied via the inverter $214_1$ to the gate of each of the NMOS of switch $212_1$ and the PMOS of switch $212_2$. The first switching signal R1K is supplied to the gate of each of the NMOS of switch $212_3$ and the PMOS of switch $212_4$. The switching signal R1K is also supplied via the inverter $214_2$ to the gate of each of the PMOS of switch $210_3$ and the NMOS of switch $212_4$. FIG. 16 shows only the portions to which addresses $Y_8$, $Y_9$, $X_{10}$, and $X_{11}$ are supplied, while omitting the portions to which the inverted addresses $/Y_8$, $/Y_9$, $/X_{10}$, and $/X_{11}$ are supplied. The circuit arrangement of the portions to which the inverted addresses are supplied is the same as that shown in FIG. 16.

With the address switching section 9 of the above construction, when the switching signal R1K is in the H-level and the switching signal R4K is in the L-level (in the case of the 1-kcycle-refresh product), switches $212_1$ and $212_3$ turn on, which allows Y-addresses $Y_8$ and $Y_9$ to be supplied as output signals A and B by way of switches $212_1$ and $212_3$.

When the switching signal R1K is in the L-level and the switching signal R4K is in the L-level (in the case of the 2-kcycle-refresh product), switches $212_1$ and $212_4$ turn on, which allows Y-address $Y_8$ and X-address $X_{10}$ to be supplied as output signals A and B by way of switches $212_1$ and $212_4$.

When the switching signal R1K is in the L-level and the switching signal R4K is in the H-level (in the case of the 4-kcycle-refresh product), switches $212_2$ and $212_4$ turn on, which allows X-addresses $X_{10}$ and $X_{11}$ to be supplied as output signals A and B by way of switches $212_2$ and $212_4$.

FIG. 22 lists the destinations of outputs A and B for each refresh cycle in the case of the x16 bit product. Characters Y8Y, Y9Y, X10X, and X11X in FIG. 22 correspond to those in FIG. 14.

Figure 17A:
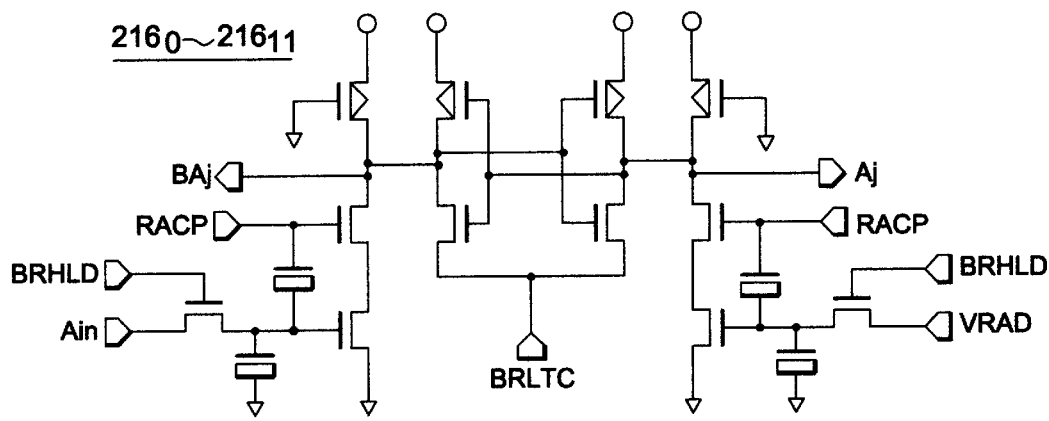
FIGS. 17A to 17C are circuit diagrams of the X-address buffer group of FIG. 14.
Figure 17B:
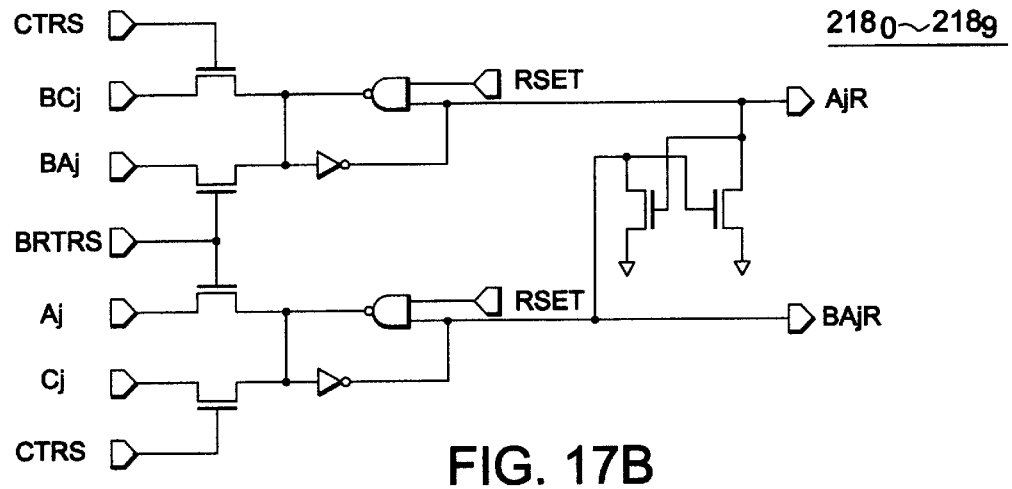
Figure 17C:
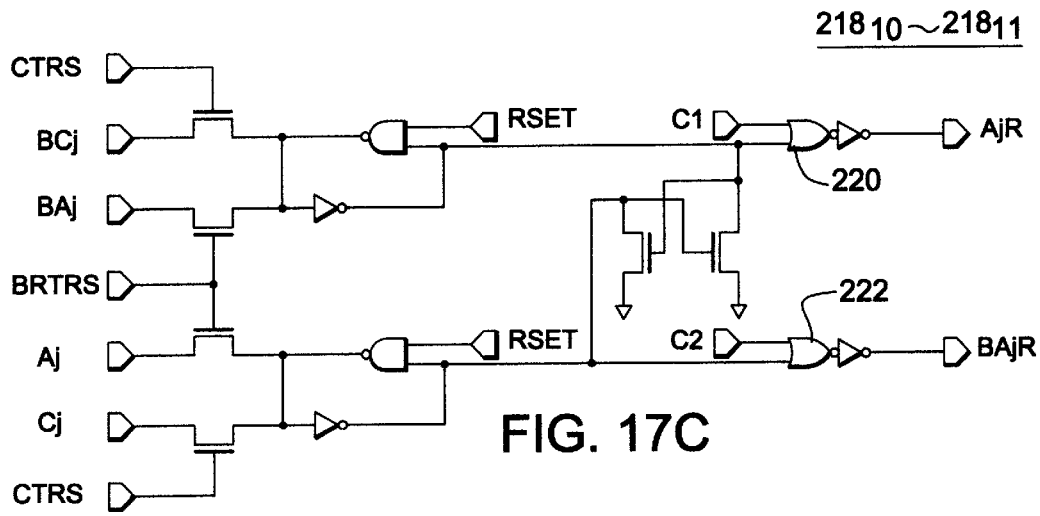

FIG. 17 is a circuit diagram of the X-address buffer group 3 of FIG. 14. FIG. 17A is a circuit diagram of the address generating section that produces addresses A0 to A11; FIG. 17B is a circuit diagram of the X-address generating section that produces X-addresses X0 (A0R) to X9 (A9R); and FIG. 17C is a circuit diagram of the X-address generating section that produces X-addresses X10 (A10R) to X11 (A11R).

As shown in FIG. 17A, the address generating section 216, which is supplied with an address input Ain, produces an address Aj and its inverted address BAj from the address input Ain on the basis of the row address accept signal RACP. In this embodiment, 12 address generating sections 216 of FIG. 17A are used. These sections $216_0$ to $216_{11}$ generate addresses A0 (BA0) to A11 (BA11), respectively. In FIG. 17A, BRHLD indicates a row address hold signal (B means the inversion of signal level), BRLTC a row address latch signal (B means the inversion of signal level), and VRAD a reference potential.

The addresses A0 (BA0) to A11 (BA11) produced at the address generating sections $216_0$ to $216_{11}$ are supplied to the X-address generating sections $218_0$ to $218_{11}$ shown in FIGS. 17B and 17C. Based on the row address transfer signal BRTRS (B means the inversion signal level), the X-address generating sections $218_0$ to $218_{11}$ produce X-addresses X0 (A0R) to X11 (A11R) from addresses A0 (BA0) to A11 (BA11). Among the X-address generating sections $218_0$ to $218_{11}$, $218_{10}$ and $218_{11}$ have the circuit construction of FIG. 17C in order to cope with a change in the number of X-addresses due to the modification of refresh cycle. Specifically, each of X-address generating sections $218_{10}$ and $218_{11}$ contains NOR circuits 220 and 222, and X-address is supplied after passing through these NOR circuits 220 and 222. The first inputs of the NOR circuits 220 and 222 are supplied with signals C1 and C2, respectively. The X-address generating sections $218_{10}$ and $218_{11}$ supply X-addresses or not, depending on the signals C1 and C2. In this embodiment, the signals C1 and C2 are set as follows: in the generating section $218_{10}$ that produces X-address X10 (A10R), the first switching signal R1K is used as signals C1 and C2; and in the switching section $218_{11}$ that produces X-address X11 (A11R), the second switching signal R2K is used as signals C1 and C2. In FIGS. 17B and 17C, Cj and BCj indicate the counter outputs, and CTRS a count transfer signal.

With the X-address generating sections $218_{10}$ and $218_{11}$ of the aforesaid construction, when the switching signal R1K is in the H-level and the switching signal R2K is in the H-level (in the case of the 1-kcycle-refresh product), the generating sections $218_{10}$ and $218_{11}$ will not produce X-addresses X10 and X11. As explained in FIG. 16, the 1-kcycle-refresh product does not use X-addresses X10 and X11 (but uses Y-addresses Y8 and Y9). As a result, unnecessary X-addresses are not produced at the X-address buffer group 3, thereby reducing the power consumption, or preventing erroneous operations.

When the switching signal R1K is in the L-level and the switching signal R2K is in the H-level (in the case of the 2-kcycle-refresh product), the generating section $218_{10}$ will produce X-address X10, and the generating section $218_{11}$ will not produce X-addresses X11. Thus, as with the 1-kcycle-refresh product, unnecessary X-addresses are not produced at the X-address buffer group 3.

When the switching signal R1K is in the L-level and the switching signal R2K is in the L-level (in the case of the 4-kcycle-refresh product), the generating sections $218_{10}$ and $218_{11}$ will both produce X-addresses X10 and X11.

Figure 18A:
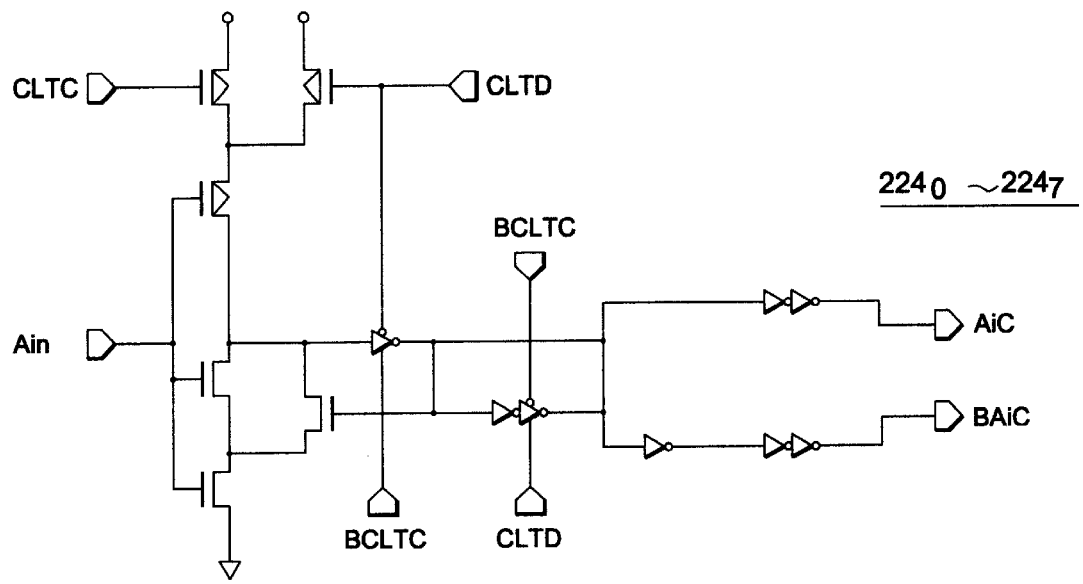
FIGS. 18A and 18B are circuit diagrams of the Y-address buffer group of FIG. 14.
Figure 18B:
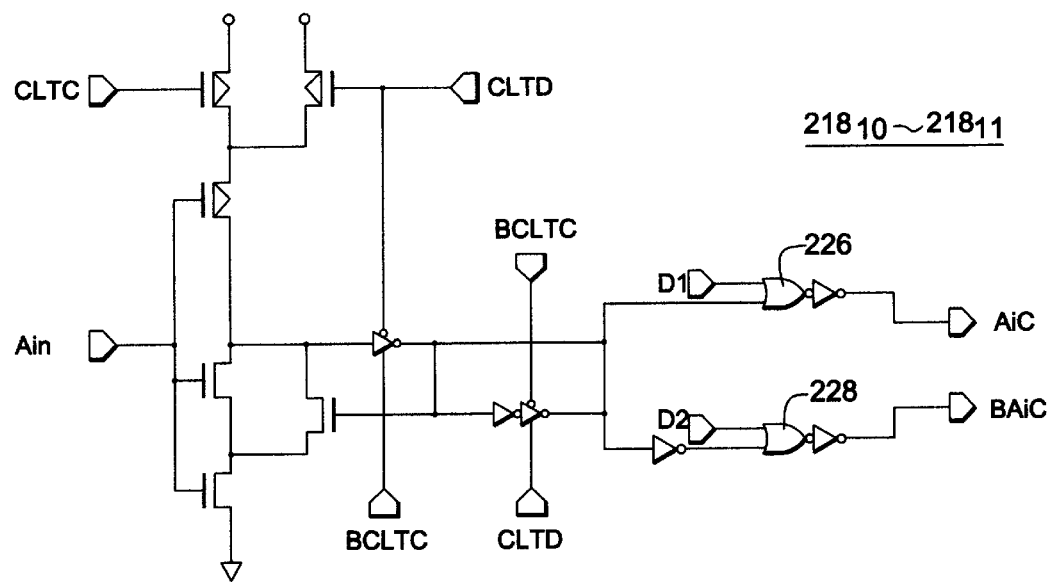

FIG. 18 is a circuit diagram of the Y-address buffer group 19 of FIG. 14. FIG. 18A is a circuit diagram of the Y-address generating section that produces Y-addresses Y0 (A0C) to Y7 (A7C) and FIG. 18B is a circuit diagram of the Y-address generating section that produces Y-addresses Y8 (A8C) to Y9 (A9C).

As shown in FIGS. 18A and 18B, the Y-address generating sections $224_0$ to $224_9$, which are supplied with address input Ain, produce Y-addresses Y0 (A0C) to Y9 (A9C) from address input Ain on the basis of a first column address latch signal CLTC and the second column address latch signal CLTD with a little delay behind the signal CLTC. Among the Y-address generating sections $224_0$ to $224_9$, $224_8$ and $224_9$ have the circuit arrangement of FIG. 18B in order to cope with a change in the number of Y-addresses due to the modification of refresh-cycle. Specifically, each of Y-address generating sections $224_8$ and $224_9$ contains NOR circuits 226 and 228, and Y-address is supplied after passing through the NOR circuits 226 and 228. The first inputs of the NOR circuits 226 and 228 are supplied with signals D1 and D2, respectively. The Y-address generating sections $224_8$ and $224_9$ supply Y-addresses or not, depending on signals D1 and D2. In this embodiment, signals D1 and D2 are set as follows: in the generating section $224_8$ that produces Y-address Y8 (A8C), the switching signal BR2K, the inversion in signal level of the second switching signal R2K, is used as signals D1 and D2; and in the generating section $224_9$ that produces Y-address Y9 (A9C), the switching signal BR1K, the inversion in signal level of the first switching signal R1K, is used as signals D1 and D2.

With the Y-address generating sections $224_8$ and $224_9$ of the aforesaid construction, when the inverted switching signal BR1K is in the L-level and the inverted switching signal BR2K is in the L-level (in the case of the 1-kcycle-refresh product), the generating sections $224_8$ and $224_9$ produce Y-addresses Y8 and Y9, respectively.

When the inverted switching signal BR1K is in the H-level and the inverted switching signal BR2K is in the L-level (in the case of the 2-kcycle-refresh product), the generating section $224_8$ will produce Y-address Y8, and the generating section $224_9$ will not produce Y-address Y9.

When the inverted switching signal BR1K is in the H-level and the inverted switching signal BR2K is in the H-level (in the case of the 4-kcycle-refresh product), none of the generating sections $224_8$ and $224_9$ produce Y-address Y8 or Y9.

FIG. 19 is a circuit diagram of the counter circuit group 37 of FIG. 14. FIG. 19A is a circuit diagram of a counter that produces counter outputs $C_0$ to $C_9$; FIG. 19B is a circuit diagram of a counter that produces counter output $C_{10}$; and FIG. 19C is a circuit diagram of a counter that produces counter output $C_{11}$.

As shown in FIG. 19A, the counter $230_0$, which is supplied with counter transfer signal CTRS (BCTRS), supplies counter output $C_0$ (BC$_0$) based on the signal CTRS (BCTRS). The counter $230_1$, which is supplied with counter output $C_0$ (BC$_0$), supplies counter output $C_1$ (BC$_1$) based on counter output $C_0$ (BC$_0$). Subsequent counters are connected the same way, and the counter $230_1$ is supplied with counter output $C_9$ (BC$_9$) as shown in FIGS. 19B and 19C. The counter $230_{10}$ supplies counter output $C_{10}$ (BC$_{10}$) based on counter output $C_9$ (BC$_9$). The counter $230_{11}$, which is supplied with counter output $C_{10}$ (BC$_{10}$), supplies counter output $C_{11}$ (BC$_{11}$) based on counter output $C_{10}$ (BC$_{10}$). Among counters $230_0$ to $230_{11}$, $231_{10}$ and $230_{11}$ have the circuit arrangement of FIGS. 19B and 19C in order to cope with a change in the number of X-addresses due to the modification of refresh cycle. Specifically, the counter $230_{10}$ contains a clocked inverter $232_{10}$ that is turned on or off based on the switching signal BR1K, the inversion in signal level of the switching signal R1K. The counter $230_{11}$ contains a clocked inverter $232_{11}$ that is turned on or off based on the switching signal R4K. Thus, depending on the switching signals R1K and R4K, the counters $232_{10}$ and $232_{11}$ supply the counter signal or not.

With the counters $232_{10}$ and $232_{11}$ of the aforesaid construction, when the switching signal R1K is in the H-level and the switching signal R4K is in the L-level (in the case of the 1-kcycle-refresh product), the counters $232_{10}$ and $232_{11}$ will not produce counter outputs $C_{10}$ and $C_{11}$.

When the switching signal R1K is in the L-level and the switching signal R4K is in the L-level (in the case of the 2-kcycle-refresh product), the counter $232_{10}$ will produce counter output $C_{10}$, and the counter $232_{11}$ will not produce counter output $C_{11}$.

When the switching signal R1K is in the L-level and the switching signal R4K is in the H-level (in the case of the 4-kcycle-refresh product), the counters $232_{10}$ and $232_{11}$ will produce counter outputs $C_{10}$ and $C_{11}$.

FIG. 20 is a circuit diagram of the word-line boosting section 41 of FIG. 14.

As shown in FIG. 20, the word-line boosting section 41 is supplied with the first and second switching signals R1K and R2K. The boosting section 41 supplies the boosting capacitance WKM based on the signal $\phi$WL commanding the boosting start. This section 41 contains a NOR gate 234 and NAND gates 236 and 238. The NOR gate 234 has a first input supplied with the switching signal R1K, and a second input with the switching signal R2K. The NAND gate 236 has a first input supplied with the signal R1K, and a second input with the signal $\phi$WL. The NAND gate 238 has a first input supplied with the inversion in signal level of the output of NOR gate 234, and a second input with the signal $\phi$WL.

With the word-line boosting section 41 of the above-described construction, when the switching signal R1K is in the H-level and the switching signal R2K is in the H-level (in the case of the 1-kcycle-refresh product), bringing signal $\phi$WL into the H-level allows one electrode of a first capacitor $240_1$ to go to the H-level. Similarly, one electrode of each of a second and third capacitors $240_2$ and $240_3$ also goes to the H-level. Therefore, in the 1-kcycle-refresh product, the boosting capacitance potential WKM is produced by using capacitors $240_1$ to $240_3$.

When the switching signal R1K is in the L-level and the switching signal R2K is in the H-level (in the case of the 2-kcycle-refresh product), bringing signal φWL into the H-level allows one electrode of the first capacitor $240_1$ to go to the L-level, and one electrode of each of the second and third capacitors $240_2$ and $240_3$ to go to the H-level. Therefore, in the 2-kcycle-refresh product, the boosting capacitance WKM is produced by using capacitors $240_2$ to $240_3$.

When the switching signal R1K is in the L-level and the switching signal R2K is in the L-level (in the case of the 4-kcycle-refresh product), bringing signal φWL into the H-level allows one electrode of each of the first and second capacitors $240_1$ and $240_2$ to go to the L-level, and one electrode of the third capacitor $240_3$ alone to go to the H-level. Therefore, in the 4-kcycle-refresh product, the boosting capacitance WKM is produced by using capacitor $240_3$ only.

Figure 23A:
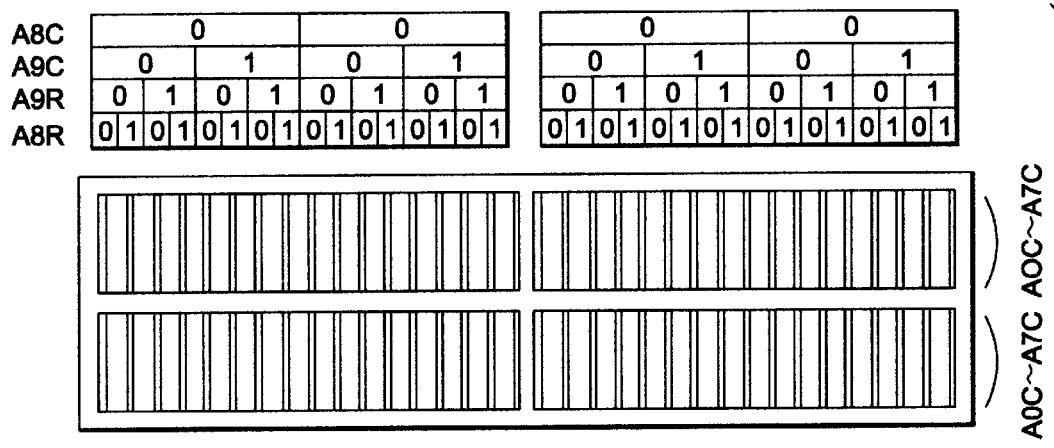
FIGS. 23A to 23C show address allocation for each refresh cycle.
Figure 23B:
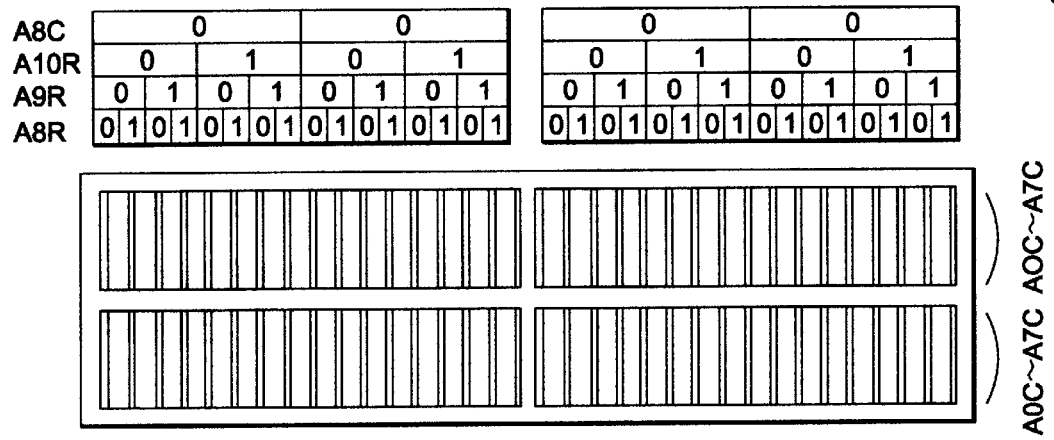
Figure 23C:
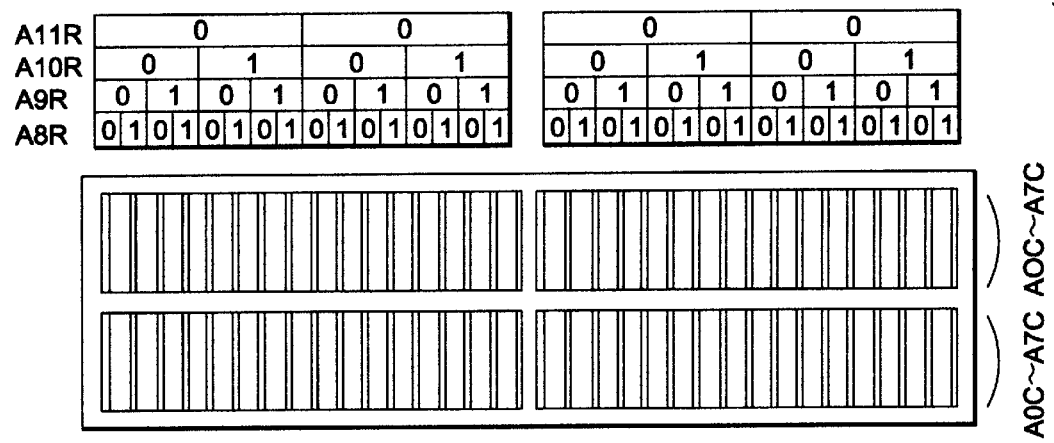

FIG. 23 shows how addresses are allocated. FIG. 23A shows the address allocation for the 1-kcycle-refresh product (mode); FIG. 23B for the 2-kcycle-refresh product (mode); and FIG. 23C for the 4-kcycle-refresh product (mode).

Figure 24:
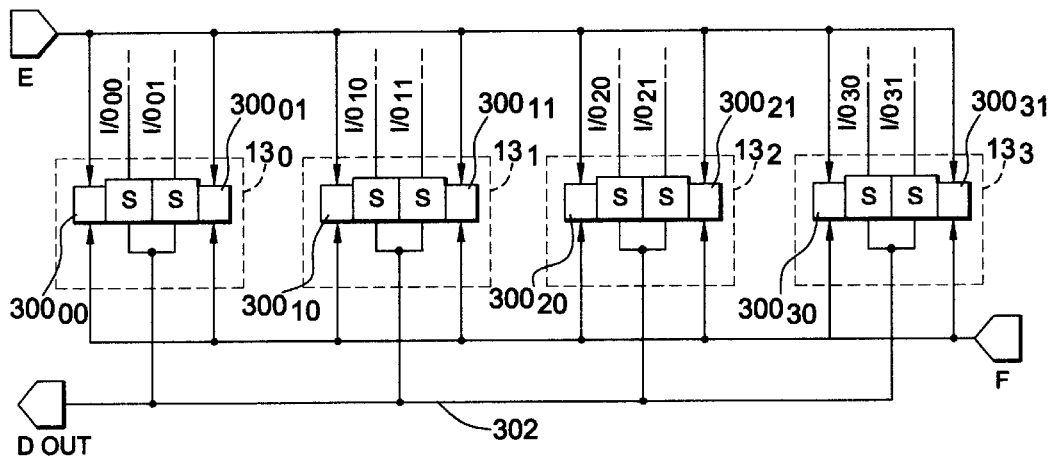
FIG. 24 is a block diagram of the I/O sense amplifier group of FIG. 1.

FIG. 24 is a block diagram showing the construction of the I/O sense amplifier groups $13_0$ to $13_3$ of FIG. 1.

As shown in FIG. 24, the I/O sense amplifier groups $13_0$ to $13_3$ contain sense circuits S and select circuits $300_{00}$ to $300_{31}$ for selecting sense circuits S. The sense circuits S are supplied with outputs $I/O_{00}$ to $I/O_{31}$ from the sense amplifiers $11_0$ to $11_3$. The select circuits $300_{00}$ to $300_{31}$, which are supplied with signals E and F, produce signals for selecting a desired sense circuit S based on signals E and F. Signal E is the output from the Y2-decoder 23, and signal F is the output of the I/O sense amplifier control circuit 31. The output of the sense circuit S selected by the select circuits $300_{00}$ to $300_{31}$ is, for example, output data $D_{OUT}$.

The I/O sense amplifier groups $13_0$ to $13_3$ of the above-described construction has the advantages of decreasing the number of data output lines 302 and simplifying the circuit arrangement of the data input/output system.

Figure 25:
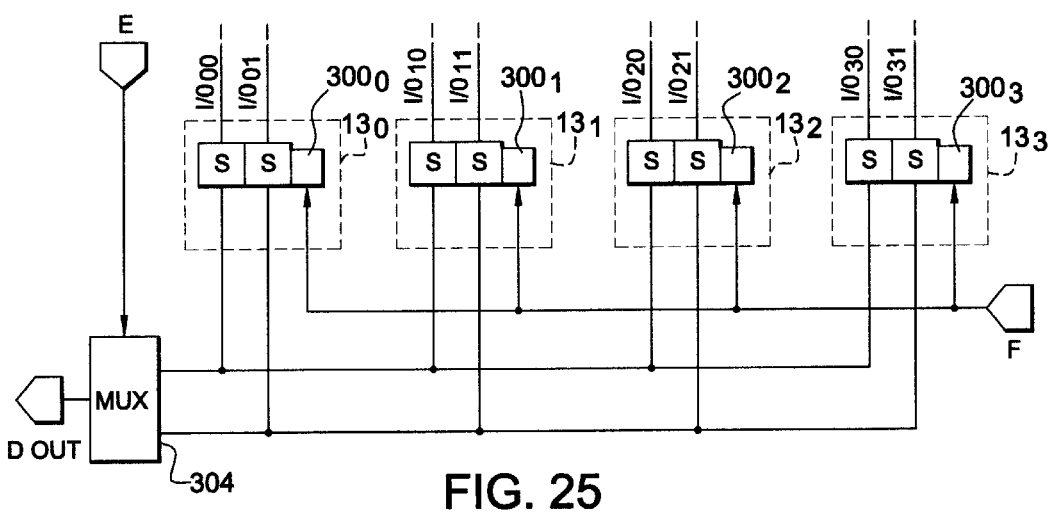
FIG. 25 is a block diagram of the I/O sense amplifier group of FIG. 1.

FIG. 25 is a block diagram showing another construction of the I/O sense amplifier groups $13_0$ to $13_3$ of FIG. 1.

As shown in FIG. 25, the I/O sense amplifier groups $13_0$ to $13_3$ contain sense circuits S and select circuits $300_0$ to $300_3$ for selecting the I/O sense amplifier groups $13_0$ to $13_3$. The sense circuits S are supplied with outputs $I/O_{00}$ to $I/O_{31}$ from the sense amplifiers $11_0$ to $11_3$. The select circuits $300_0$ to $300_3$, which are supplied with signal F, produce signals for selecting a desired sense amplifier group $13_0$ to $13_3$ based on signal F. Signal F is the output of the I/O sense amplifier control circuit 31. The output signal from the sense amplifier group S selected by the select circuits $300_0$ to $300_3$ is supplied to a multiplexer circuit 304, which selects a desired sense circuit S based on signal E, for example. The signal E is the output of the Y2 decoder 23. The output of the sense circuit S selected by the multiplexer circuit 304 is, for example, output data $D_{OUT}$.

The I/O sense amplifier groups $13_0$ to $13_3$ of the above-described construction has the advantage of simplifying the circuit arrangement of the I/O sense amplifier groups $13_0$ to $13_3$.

Figure 26:
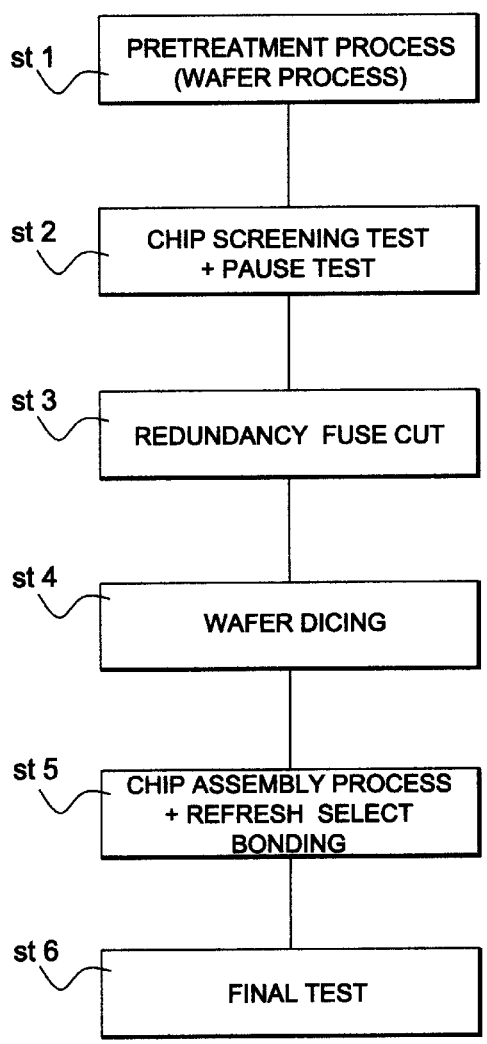
FIG. 26 is a flowchart of a chip screening method according to the present invention.

FIG. 26 is a flowchart of a chip selecting method according to the present invention.

This flowchart is used with a device that determines the product specification according to the bonding option shown in FIG. 2.

As shown in FIG. 26, at step 1, a pretreatment wafer process is performed to form DRAM chips (integrated circuit chips) in the wafer. After the DRAM chips have been formed, at step 2, a chip screening test is made to see whether the formed DRAM chips are acceptable or not. After this, a pause test (a data retention test) is carried out to determine how long the memory cell in the DRAM chips can retain the data. At step 3, redundancy fuse-cut is performed to save the chips judged to be unacceptable at the step 2 chip screening test, to some extent (redundancy techniques). At step 4, the wafer undergoes dicing, which divides the wafer into a plurality of DRAM chips. At step 5, the chips are assembled. In this process, each chip is mounted on a bed and the chip's pad is bonded to a lead. At this time, based on the result of the step 2 pause test, bonding is done to select a refresh-cycle mode. This process is done depending on whether a wire is bonded to the bonding pad P of the receiving section 27 of FIG. 2. This bonding determines, for example, the 2-kcycle-refresh product (mode) or the 4-kcycle-refresh product (mode) semipermanently. Then, the packaging process is carried out to form the final product. After this, at step 6, a final test is performed, and the products that have passed this test are put on the market.

Figure 27:
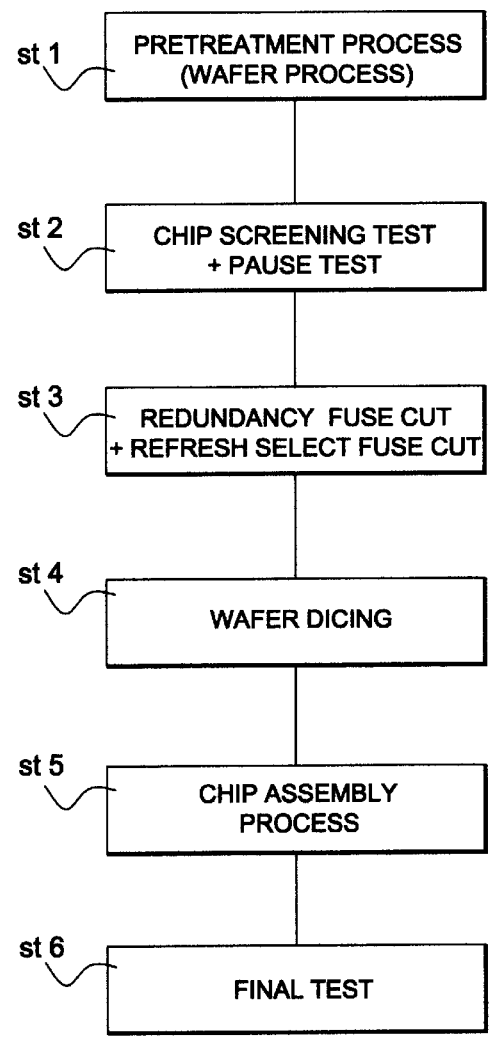
FIG. 27 is a flowchart of another example of the chip screening method.

FIG. 27 is another flowchart of a chip screening select method according to the present invention.

This flowchart is used with a device that determines the product specification according to the fuse option shown in FIG. 3.

As shown in FIG. 27, at step 3, redundancy fuse-cutting is done. In this step, refresh-cycle select fuse cutting is also done. In this process, the fuse F of the receiving section 27 of FIG. 3 is blown or not. As with the method of FIG. 26, this fuse cutting determines, for example, the 2-kcycle-refresh product (mode) or the 4-kcycle-refresh product (mode) semipermanently.

Since the chip select method determines the 2-kcycle-refresh product (mode) or the 4-kcycle-refresh product (mode) on the basis of the result of the pause test, even if, for example, chips with memory cells whose pause time is shorter than the design pause time due to variations in the processes, they may be saved as the 4-kcycle-refresh product (mode), thereby improving the product yield.

Even in the course of manufacturing, it is easy to change the product specification from the 2-kcycle-refresh product (mode) to the 4-kcycle one or vice versa, providing flexibility in manufacturing products.

Figures 28, 29:
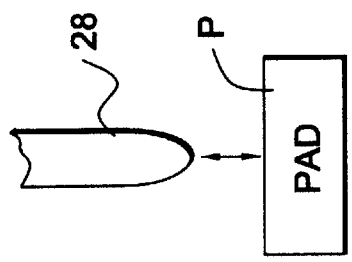
FIG. 28 shows the contents of step 2 in FIGS. 26 and 27.
FIG. 29 is a sectional view of the pad of FIG. 2.

FIG. 28 shows the contents of step 2 in FIGS. 26 and 27 in detail.

As shown in FIG. 28, the tests at step 2 are broadly divided into two tests: a chip screening test and a pause test. Of these tests, the chip screening test is further divided into subtests: for example, an operating current test, a typical voltage test, a cell to cell interference test, and others. Each test has its own optimum refresh-cycle. Therefore, setting the optimum refresh-cycle before each test makes it possible to shorten the test time and improve the select capability, thereby improving the chip select test efficiency.

For example, the operating current test in test item TEST A is made with a 2-kcycle-refresh. With the operating current test with a 2-kcycle-refresh, the chip select conditions can be made more severe than those with a 4-kcycle-refresh, making it possible to select only chips with very high reliability.

The typical voltage test in test item TEST B is carried out with a 4-kcycle-refresh. In the typical voltage test with a 4-kcycle-refresh, the short-circuit of word lines (for example, adjacent word lines) that is unacceptable in the 2-kcycle-refresh product is acceptable in the 4-kcycle-refresh product, thereby increasing the number of acceptable products. When 2-kcycle-refresh products are to be obtained from the lot subjected to this test, however, there is a possibility that unacceptable products may also be included in them. To avoid this problem, the typical voltage test with 2-kcycle-refresh should be made. When only 4-kcycle-refresh products are obtained, the typical voltage test with 2-kcycle-refresh may not be performed. In this way, the test may be made with 2-kcycle-refresh or 4-kcycle-refresh as required.

The cell-to-cell interference test in test item TEST C is made with the 2-kcycle-refresh product. The cell-to-cell interference test with a 2-kcycle-refresh allows current to flow to all memory cells in a shorter time than that with 4-kcycle-refresh, thereby shortening the test time.

For the tests not shown in FIG. 28, the respective optimum refresh-cycles are set similarly.

FIG. 29 is a sectional view of the pad P of FIG. 2.

Setting the optimum refresh-cycle for each test can be achieved by simply bringing the probe 28 of the wafer prober into contact with the bonding pad P as shown in FIG. 29, and applying a voltage to the receiving section 27 or not.

The present invention is not limited to the above embodiments, and may be practiced or embodied in still other ways without departing from the spirit or essential character thereof. For example, in the foregoing embodiments, the decision signal SDS to determine the product specification is supplied to the receiving section 27 by means of wire bonding or the cutting of fuse F. Instead of the fuse F, a nonvolatile memory cell may be used to supply the decision signal SDS depending on whether the cell turns on or not.

Also, the package may have an additional pin, to which the signal SDS is supplied, so that the user can select one of the two refresh-cycle modes by supplying the signal SDS to the additional pin, and the other refresh-cycle mode by not supplying the signal SDS to the additional pin. Further, the package may have two or more additional pins, to which the signals VR1K, VR2K are supplied, so that the user can select any desired one of three or more refresh-cycle modes by supplying the signal SDS to one or more of the additional pins.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor integrated circuit device comprising:
   a switching signal generator having an output terminal which outputs a switching signal to change refresh modes;
   a first address buffer having an output terminal which outputs a first address signal;
   a second address buffer having an output terminal which outputs a second signal;
   a decoder having a first input terminal which receives the first address signal and having a second input terminal;
   a sense amplifier controller having an input terminal; and
   a switch having a first input terminal which receives the switching signal, a second input terminal which receives the second address signal, a first output terminal which outputs the second address signal to the second input terminal of the decoder and a second output terminal which outputs the second address signal to the input terminal of the sense amplifier controller, the switch being controlled by the switching signal.

2. The semiconductor integrated circuit device according to claim 1, wherein the switch transfers the second address signal to the second input terminal of the decoder if the switching signal specifies a first refresh mode, and
   the switch transfers the second address signal to the input terminal of the sense amplifier controller if the switching signal specifies a second refresh mode.

3. A semiconductor integrated circuit device comprising:
   a switching signal generator having an output terminal which outputs a switching signal to change refresh modes;
   a first address buffer having an output terminal which outputs a first address signal;
   a second address buffer having an output terminal which outputs a second output terminal;
   a decoder having a first input terminal which receives the first address signal and having a second input terminal;
   a sense amplifier controller having an input terminal;
   a first switch having a first input terminal which receives the switching signal, a second input terminal which receives the second address signal and an output terminal which outputs the second address signal to the second input terminal of the decoder, the first switch being controlled by the switching signal; and
   a second switch having a first input terminal which receives the switching signal, a second input terminal which receives the second address signal and an output terminal which outputs the second address signal to the input terminal of the sense amplifier controller, the second switch being controlled by the switching signal, and the second switch being switched off when the first switch is switched on and being switched on when the first switch is switched off.

4. A semiconductor integrated circuit device comprising:
   a switching signal generator having an output terminal which outputs a switching signal to change refresh modes;
   a first address buffer having an output terminal which outputs a first address signal;
   a second address buffer having an output terminal which outputs a second address signal;
   a third address buffer having an output terminal which outputs a third address signal;
   a decoder having a first input terminal which receives the first address signal and having a second input terminal;
   a sense amplifier controller having an input terminal; and
   a switch having a first input terminal which receives the switching signal, a second input terminal which receives the second address signal, a third input terminal which receives the third address signal, a first output terminal which outputs the second address signal to the second input terminal of the decoder, a second output terminal which outputs the third address signal to the input terminal of the sense amplifier controller, the switch being controlled by the switching signal.

5. The semiconductor integrated circuit device according to claim 4, wherein the switch transfers the second address signal to the second input terminal of the decoder if the switching signal specifies a first refresh mode, and the switch transfers the third address signal to the input terminal of the sense amplifier controller if the switching signal specifies a second refresh mode.

6. A semiconductor integrated circuit device comprising:

a switching signal generator having an output terminal which outputs a switching signal to change a refresh mode;

a first address buffer having an output terminal which outputs a first address signal;

a second address buffer having an output terminal which outputs a second address signal;

a third address buffer having an output terminal which outputs a third address signal;

a decoder having having a first input terminal which receives the first address signal and having a second input terminal;

a sense amplifier controller having an input terminal;

a first switch having a first input terminal which receives the switching signal, a second input terminal which receives the second address signal and an output terminal which outputs the second address signal to the second input terminal of the decoder, the first switch being controlled by the switching signal; and a second switch having a first input terminal which receives the switching signal, a second input terminal which receives the third address signal and an output terminal which outputs the third address signal to the input terminal of the sense amplifier controller, the second switch being controlled by the switching signal, and the second switch being switched off when the first switch is switched on and being switched on when the first switch is switched off.

7. A semiconductor integrated circuit device comprising:

a switching signal generator having an output terminal which outputs a switching signal to change refresh modes;

a first address buffer having an output terminal which outputs a first address signal;

a second address buffer having an output terminal which outputs a second address signal;

a third address buffer having an output terminal which outputs a third address signal;

a first decoder having a first input terminal which receives the first address signal and having a second input terminal;

a second decoder having an input terminal;

a sense amplifier controller having an input terminal; and a switch having a first input terminal which receives the switching signal, a second input terminal which receives the second address signal, a third input terminal which receives the third address signal, a first output terminal which outputs the second address signal to the second input terminal of the first decoder, a second output terminal which outputs the second address signal to the input terminal of the second decoder, a third output terminal which outputs the third address signal to the input terminal of the sense amplifier controller and a fourth output terminal which outputs the third address signal to the input terminal of the second decoder, the switch being controlled by the switching signal.

8. The semiconductor integrated circuit device according to claim 7, wherein the switch transfers the second address signal to the second input terminal of the first decoder and the the third address signal to the input terminal of the second decoder if the switching signal specifies a first refresh mode, and the switch transfers the second address signal to the input terminal of the second decoder and the third address signal to the input terminal of the sense amplifier controller if the switching signal specifies a second refresh mode.

9. A semiconductor integrated circuit device comprising:

a switching signal generator having an output terminal which outputs a switching signal to change refresh modes;

a first address buffer having an output terminal which outputs a first address signal;

a second address buffer having an output terminal which outputs a second address signal;

a third address buffer having an output terminal which outputs a third address signal;

a first decoder having a first input terminal which receives the first address signal and having a second input terminal;

a second decoder having an input terminal;

a sense amplifier controller having an input terminal; and a first switch having a first input terminal which receives the switching signal, a second input terminal which receives the second address signal and an output terminal which outputs the second address signal to the second input terminal of the first decoder, the first switch being controlled by the switching signal;

a second switch having a first input terminal which receives the switching signal, a second input terminal which receives the second address signal and an output terminal which outputs the second address signal to the input terminal of the second decoder, the second switch being controlled by the switching signal, and the second switch being switched off when the first switch is switched on and being switched on when the first switch is switched off;

a third switch having a first input terminal which receives the switching signal, a second input terminal which receives the third address signal and an output terminal which outputs the third address signal to the input terminal of the sense amplifier controller, the third switch being controlled by the switching signal, and the third switch being switched off when the second switch is switched off and being switched on when the second switch is switched on; and a fourth switch having a first input terminal which receives the switching signal, a second input terminal which receives the third address signal and an output terminal which outputs the third address signal to the input terminal of the second decoder, the fourth switch being controlled by the switching signal, the fourth switch being switched off when the third switch is switched on and being switched on when the third switch is switched off.

10. A semiconductor integrated circuit device comprising:

a switching signal generator having first, second and third terminals which outputs first, second and third switching signals, respectively, to change refresh modes;

a first address buffer having an output terminal which outputs a first address signal;

a second address buffer having an input terminal which receives the first switching signal and an output terminal which outputs a second address signal, the second address buffer being controlled by the first switching signal;

a third address buffer having an input terminal which receives the second switching signal and an output terminal which outputs a third address signal, the third address buffer being controlled by the second switching signal;

a fourth address buffer having an input terminal which receives the first switching signal and an output terminal which outputs a fourth address signal, the fourth address buffer being controlled by the first switching signal;

a fifth address buffer having an input terminal which receives the second switching signal and an output terminal which outputs a fifth address signal, the fifth address buffer being controlled by the second switching signal;

a decoder having a first input terminal which receives the first address signal and having a second input terminal and a third input terminal;

a sense amplifier controller having a first input terminal a second input terminal; and a switch having first, second, third, fourth, fifth and sixth input terminals which receives the first switching signal, the third switching signal, the second, third, fourth and the fifth address signals, respectively, and having first, second, third and fourth output terminals which outputs the second address signal to the second input terminal of the decoder, the third address signal to the third input terminal of the decoder, the fourth address signal to the first input terminal of the sense amplifier controller and the fifth address signal to the second input terminal of the sense amplifier controller, respectively, the switch being controlled by the first and third switching signals.

11. The semiconductor integrated circuit device according to claim 10, wherein the switch transfers the fourth address signal to the first input terminal of the sense amplifier controller and the fifth address signal to the second input terminal of the sense amplifier controller if the first and third switching signals specify a first refresh mode, the switch transfers the fourth address signal to the first input terminal of the sense amplifier controller and the second address signal to the second input terminal of the decoder if the first and third switching signals specify a second refresh mode, and the switch transfers the third address signal to the third input terminal of the decoder and the second address signal to the second input terminal of the decoder if the first and third switching signals specify a third refresh mode.

12. The semiconductor integrated circuit device according to claim 10, further comprising:

a first counter having an input terminal which receives the first switching signal and an output terminal which outputs a first counter output, the first counter being controlled by the first switching signal; and a second counter having an input terminal which receives the third switching signal and an output terminal which outputs a second counter output, the second counter being controlled by the third switching signal.

13. The semiconductor integrated circuit device according to claim 12, wherein the second address buffer has a first input terminal to receive the first address signal and a second input terminal to receive the first counter output, and the third address buffer has a first input terminal to receive the second address signal and a second input terminal to receive the second counter output.

14. The semiconductor integrated circuit device according to claim 10, further comprising:

a word-line boosting section having a first input terminal which receives the first switching signal, a second input terminal which receives the second switching signal and an output terminal which outputs a boosting potential, and the word-line boosting section being controlled by the first and second switching signals.

* * * * *

UNITED STATES PATENT AND TRADEMARK OFFICE
CERTIFICATE OF CORRECTION

PATENT NO. : 6,141,288
DATED : October 31, 2000
INVENTOR(S) : Kenji Numata, et al.

It is certified that error appears in the above-identified patent and that said Letters Patent is hereby corrected as shown below:

Title page, in References Cited [56]:

Under U.S. PATENT DOCUMENTS;

-- 5,812,481   9/1998  Numata et al.   365/230.06 -- has been inserted.

Under FOREIGN PATENT DOCUMENTS;

-- 5-282864   10/1993   Japan -- has been inserted.

-- OTHER PUBLICATIONS

Horiguchi et al., "A Tunable CMOS-DRAM Voltage Limited With Stabilized Feedback Amplifier", IEEE Journal of Solid-State Circuits, No. 5, New York pp. 1129-1134, October 1990. -- has been inserted.

Signed and Sealed this

Thirty-first Day of July, 2001

*Attest:*

*Attesting Officer*

NICHOLAS P. GODICI
*Acting Director of the United States Patent and Trademark Office*